(12) United States Patent
Fujioka et al.

(10) Patent No.: US 8,149,644 B2
(45) Date of Patent: Apr. 3, 2012

(54) MEMORY SYSTEM AND METHOD THAT CHANGES VOLTAGE AND FREQUENCY

(75) Inventors: Shinya Fujioka, Kawasaki (JP); Yasuyuki Eguchi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 616 days.

(21) Appl. No.: 12/257,799

(22) Filed: Oct. 24, 2008

(65) Prior Publication Data

US 2009/0154257 A1 Jun. 18, 2009

(30) Foreign Application Priority Data

Dec. 17, 2007 (JP) ................................. 2007-324908

(51) Int. Cl.
*G11C 8/00* (2006.01)
(52) U.S. Cl. ................. 365/233.1; 365/189.11; 365/224; 326/80; 713/100; 713/322
(58) Field of Classification Search .................. 365/226, 365/233.1, 189.11; 326/80, 81; 713/100, 713/322
See application file for complete search history.

(56) References Cited

U.S. PATENT DOCUMENTS 7,005,889 B2 * 2/2006 Sowden et al. ................. 326/81
7,035,148 B2 * 4/2006 Chung et al. ............. 365/189.05
7,133,318 B2 11/2006 Chung et al.

FOREIGN PATENT DOCUMENTS

JP 2004-139718 A 5/2004
WO WO 2007/117745 A2 10/2007

OTHER PUBLICATIONS

Torres, Gabriel "Memory Overclocking," http://www.hardwaresecrets.com/printpage/Memory-Overclocking/152 published Jun. 19, 2005, retrieved Mar. 8, 2011.*
JEDEC DDR SDRAM Specification "JESD79C", Published Mar. 2003.*
Oli "PC Hardware" Overview of Computer Science, Published Dec. 6, 2002.*
ASUS, "P4B533-E User Guide," published Oct. 2002.*

* cited by examiner

*Primary Examiner* — Tuan T Nguyen
*Assistant Examiner* — Lance Reidlinger
(74) *Attorney, Agent, or Firm* — Arent Fox LLP

(57) ABSTRACT

The memory system includes a semiconductor memory that has an internal circuit, which operates according to a first power supply voltage, and a memory input/output circuit coupled to the internal circuit and operates according to a second power supply voltage, a first control unit that includes a control input/output circuit, coupled to the memory input/output circuit and operates according to the second power supply voltage, a voltage generating unit that generates the second power supply voltage and changes the second power supply voltage according to a voltage adjustment signal, a clock generating unit that generates the clock signal and changes the frequency of the clock signal according to a clock adjustment signal, and a second control unit that generates the voltage adjustment signal and the clock adjustment signal according to an access state of the semiconductor memory by the first control unit.

19 Claims, 27 Drawing Sheets

FIG. 3

VDD=1.8 V, VDDE=1.0 V

| OPERATION MODE | MD1 | MD2 | MD3 | MD4 | MD5 |
|---|---|---|---|---|---|
| HVZ (SW1/SW2) | H (on/off) ⇔ | L (off/on) | L (off/on) | L (off/on) | L (off/on) |
| HFZ | H | H ⇔ | L | L | L |
| LT4Z | H | H | H ⇔ | L | L |
| TYPZ | H | H | H | H ⇔ | L |
| VDDQ[V] | 1.8 | 1.2 | 1.2 | 1.2 | 1.2 |
| MCLK[MHZ] (tCK[ns]) | 100 (10) | 100 (10) | 50 (20) | 50 (20) | 50 (20) |
| LAT[-] | 4 | 4 | 4 | 2 | 2 |
| DRV[-] | TYP | TYP | TYP | TYP | STG |
| IDD[mA] | 100 | 67 | 60 | 50 | 50 |
| tAC[ns] | 6 | 10 | 10 | 10 | 6 |
| tAC/tCK[-] PWR[mW] | 0.6 / 180 mW | 1.0 / 80 mW | 0.5 / 72 mW | 0.5 / 60 mW | 0.3 / 60 mW |

FIG. 22

VDD=1.8 V, VDDE=1.0 V

| OPERATION MODE | MD1 | MD2 | MD3 |
|---|---|---|---|
| HVZ (SW1/SW2) | H (on/off) | L (off/on) | L (off/on) |
| HFZ | H | H | L |
| LT4Z | H | H | H |
| TYPZ | H | H | H |
| VDDQ[V] | 1.8 | 1.2 | 1.2 |
| MCLK[MHZ] (tCK[ns]) | 100 (10) | 100 (10) | 50 (20) |
| LAT[-] | 4 | 4 | 4 |
| DRV[-] | TYP | TYP | TYP |
| IDD[mA] | 100 | 67 | 60 |
| tAC[ns] | 6 | 10 | 10 |
| tAC/tCK[-] PWR[mW] | 0.6 / 180 mW | 1.0 / 80 mW | 0.5 / 72 mW |

FIG. 23

| OPERATION MODE | MD1 | MD2 | MD3 | MD4 |
|---|---|---|---|---|
| HVZ (SW1/SW2) | H (on/off) | ↕ H (on/off) | L (off/on) | L (off/on) |
| HFZ | H | ↕ L | L | L |
| LT4Z | H | ↕ L | L | L |
| TYPZ | H | H | H ↕ | L |
| VDDQ[V] | 1.8 | 1.8 | 1.2 | 1.2 |
| MCLK[MHZ] (tCK[ns]) | 100 (10) | 50 (20) | 50 (20) | 50 (20) |
| LAT[-] | 4 | 2 | 2 | 2 |
| DRV[-] | TYP | TYP | TYP | STG |

VDD=1.8V, VDDE=1.0V

MEMORY SYSTEM AND METHOD THAT CHANGES VOLTAGE AND FREQUENCY

CROSS-REFERENCE TO RELATED APPLICATIONS

This application claims the benefit of priority from Japanese Patent Application No. 2007-324908 filed on Dec. 17, 2007, the entire contents of which are incorporated herein by reference.

BACKGROUND OF THE INVENTION

1. Field of the Invention

This application relates to a system having a semiconductor memory.

2. Description of Related Art

In a semiconductor memory, an output driver changes the driving capability thereof according to a latency, which is the number of clock cycles since a read command has been received until the read data has started to be outputted, or according to the frequency of a clock signal. This output driver is disclosed in Japanese Laid-open Patent Publication No. 2004-139718.

Additional advantages and novel features of the invention will be set forth in part in the description that follows, and in part will become more apparent to those skilled in the art upon examination of the following or upon learning by practice of the invention.

SUMMARY

According to one aspect of an embodiment, a memory system is provided. The memory system comprises: a semiconductor memory that includes an internal circuit, which operates according to a first power supply voltage, and a memory input/output circuit, which is coupled to the internal circuit and operates according to a second power supply voltage, where the semiconductor memory operates in synchronization with a clock signal; a first control unit that includes a control input/output circuit, which is coupled to the memory input/output circuit and operates according to the second power supply voltage, where the first control unit operates in synchronization with the clock signal; a voltage generating unit that generates the second power supply voltage and changes the second power supply voltage according to a voltage adjustment signal; a clock generating unit that generates the clock signal and changes the frequency of the clock signal according to a clock adjustment signal; and a second control unit that generates the voltage adjustment signal and the clock adjustment signal according to an access state of the semiconductor memory by the first control unit.

BRIEF DESCRIPTION OF THE DRAWINGS

FIG. 3 shows a operation mode of a DRAM;
FIG. 22 shows a sixth embodiment;
FIG. 23 shows a seventh embodiment.

DESCRIPTION OF PREFERRED EMBODIMENTS

In the figures, a signal line shown in heavy line includes a plurality of signal lines. In the figures, a portion of a block to which the heavy line is coupled includes a plurality of circuits. The same reference symbols as those for signals are attached to a signal line through which the signals transmit. A signal having "Z" at the end represents a positive logic. A signal having "/" at the head represents a negative logic.

Figure 1:
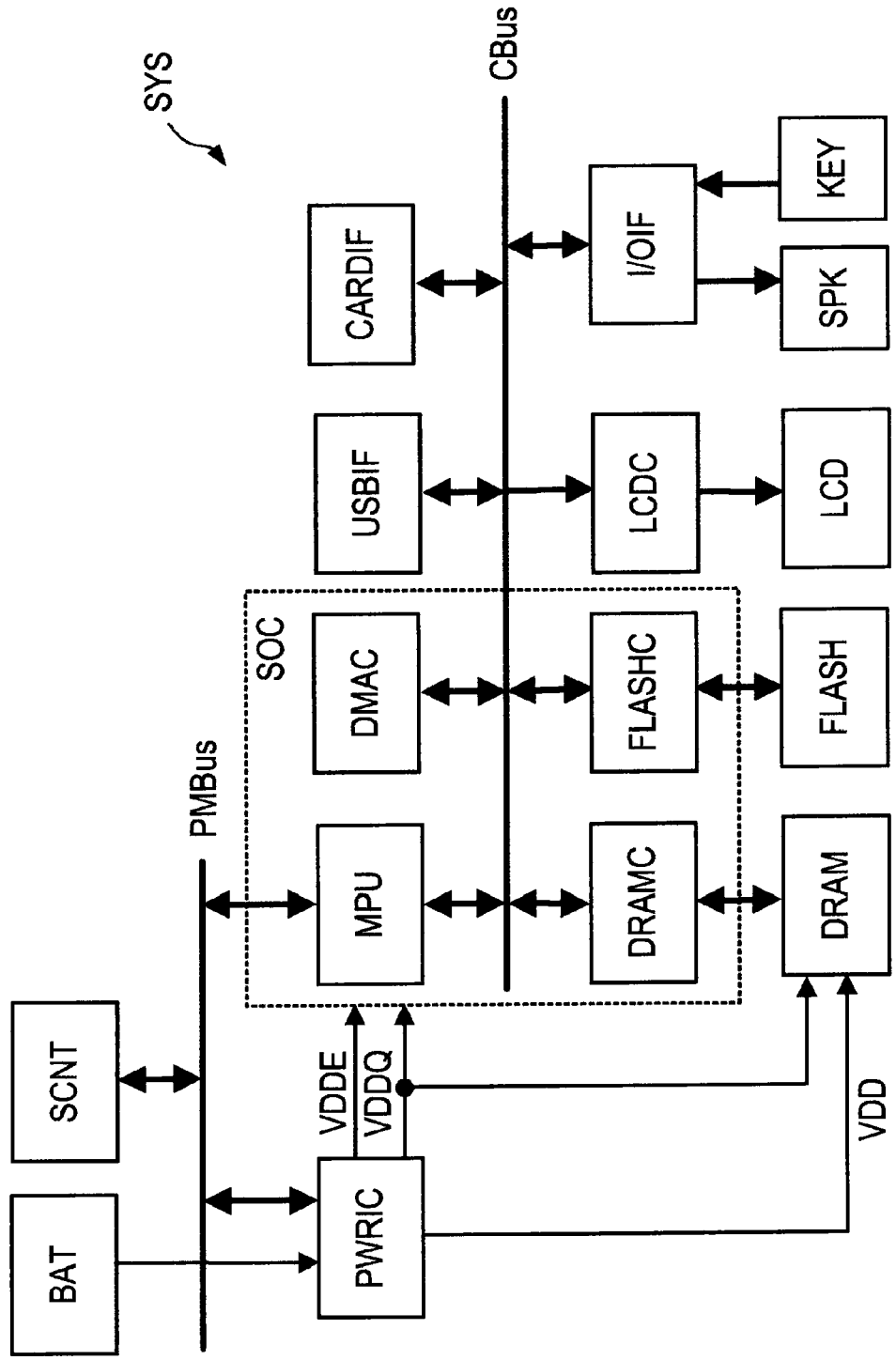
FIG. 1 shows a first embodiment.

FIG. 1 shows a first embodiment. For example, a system device SYS is a portable device (e.g., portable video game player, mobile phone, or the like). In FIG. 1, elements for communication functions are omitted.

The system device SYS includes a battery BAT, a system controller SCNT, a power supply controller PWRIC, a microcontroller MPU, a dynamic memory access controller DMAC, a memory controller DRAMC, a memory controller FLASHC, a DRAM (semiconductor memory), a flash memory FLASH, a USB interface USBIF, a card interface CARDIF, a liquid crystal controller LCDC, a liquid crystal display LCD, an input/output interface I/OIF, a speaker SPK, a key-input device KEY, and the like. The MPU, the DMAC, and the memory controllers DRAMC and the FLASHC are constituted by one chip as a system-on-chip SOC. For example, the system controller SCNT, the power supply controller PWRIC, the DRAM, the flash memory FLASH and the liquid crystal controller LCDC are each constituted by a single semiconductor chip. At least one of the system controller SCNT, the power supply controller PWRIC, the DRAM, the flash memory FLASH and the liquid crystal controller LCDC may be mounted on the SOC. Further, the function of the system controller SCNT may be achieved by the microcontroller MPU.

The system controller SCNT is coupled to the power supply controller PWRIC and the microcontroller MPU via a power management bus (PMBus), for example. The system controller SCNT controls the power supply controller PWRIC and the microcontroller MPU according to the access state of the DRAM (operating state of the system device SYS), in order to optimally adjust the power consumption of the DRAM. The power supply controller PWRIC receives power supply from the battery BAT, and, based on an instruction from the system controller SCNT, supplies power supply voltages VDDE and VDDQ to the SOC, and supplies power supply voltages VDD and VDDQ to the DRAM. The power supply controller PWRIC may receive external power supply from the outside of the system device SYS.

Figure 5:
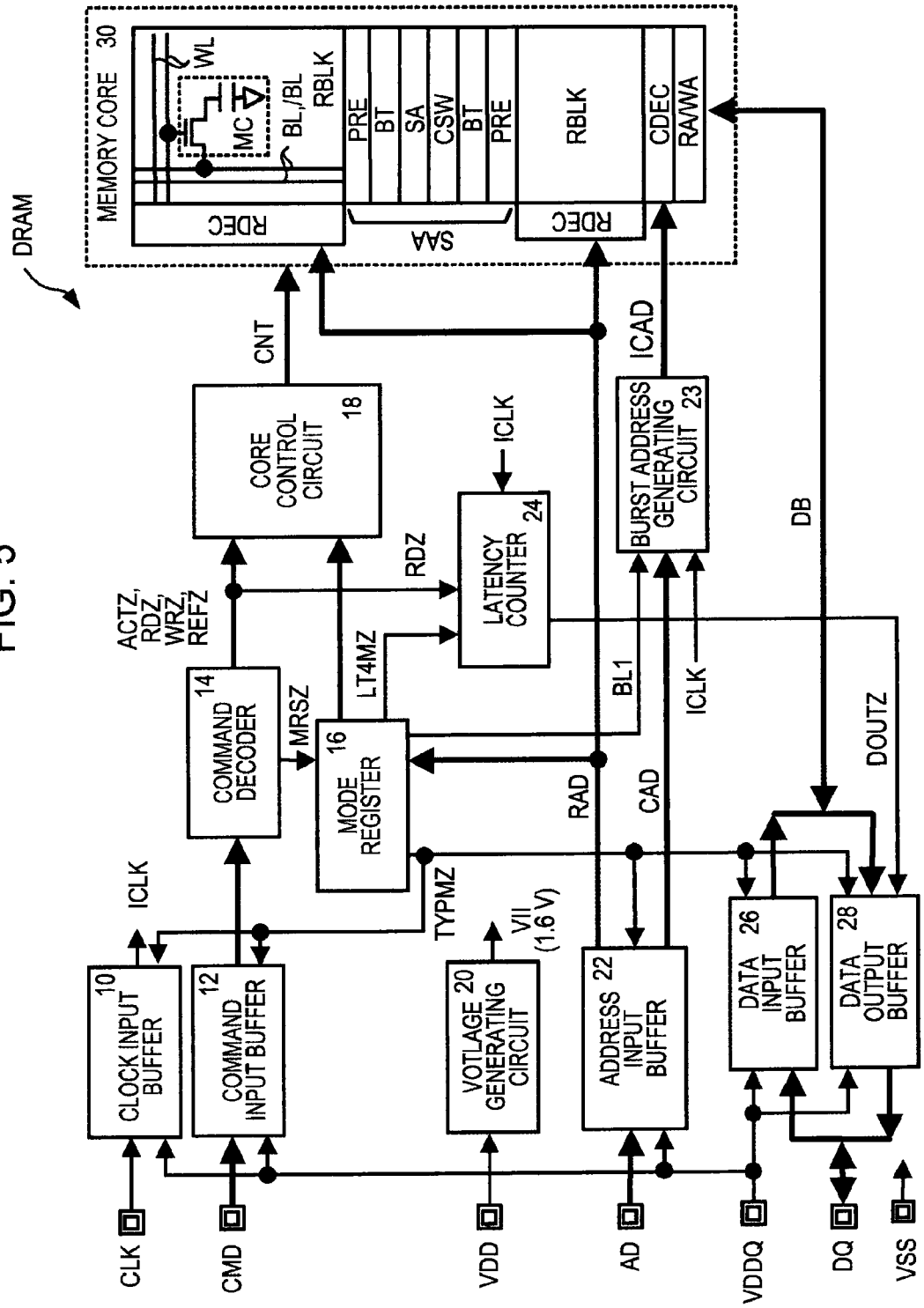
FIG. 5 shows an example of the DRAM.

The power supply voltage VDDE is a power supply voltage for the SOC. The microcontroller MPU, the DMAC, and the memory controllers DRAMC and the FLASHC operate based on the power supply voltage VDDE. The power supply voltage VDD is a power supply voltage for an internal circuit of the DRAM. As shown in FIG. 5, the DRAM generates an internal power supply voltage VII for operating the internal circuit using the power supply voltage VDD to. The power supply voltage VDDQ is a power supply voltage for an input/output circuit of the memory controller DRAMC and for an input/output circuit of the DRAM. The power supply voltages VDDE, VDD and VDDQ may be supplied to other chips. The power supply controller PWRIC may supply another power supply voltage, which is not shown, to the liquid crystal controller LCDC and the like, for example.

The MPU, the DMAC, the DRAMC, the memory controller FLASHC, the USB interface USBIF, the card interface CARDIF, the liquid crystal controller LCDC and the input/output interface I/OIF are coupled to a common bus CBus. For example, the microcontroller MPU executes a program kept in the DRAM to control the entire system device SYS. For example, the DMAC transfers to the DRAM, programs and various parameters stored in the flash memory FLASH at power-on of the system device SYS. The DMAC transfers to the flash memory FLASH, various parameters kept in the DRAM at power-off of the system device SYS. The memory controller DRAMC receives an access request (write request, read request, mode register set request, or the like) to the DRAM from the microcontroller MPU or the DMAC, and accesses the DRAM. The memory controller DRAMC outputs to the DRAM, a refresh request for refreshing the DRAM at a predetermined frequency.

The memory controller FLASHC receives an access request (read request, program request, erase request, or the like) to the flash memory FLASH from the microcontroller MPU or the DMAC, and accesses the flash memory FLASH.

When a device having a USB interface is coupled, the USB interface USBIF inputs/outputs data to/from the coupled device. When a device having a card interface is coupled, the card interface CARDIF inputs/outputs data to/from the coupled device. The liquid crystal controller LCDC outputs image data, which is supplied through the common bus CBus, to the liquid crystal display LCD, in order to display an image on the liquid crystal display LCD. The image data may be kept in the DRAM, or in an image memory, which is not shown. The input/output interface I/OIF converts digital audio data into analog audio data, for example, and outputs the analog audio data to the speaker SPK. When receiving key-input information from the key-input device KEY, the input/output interface I/OIF outputs an interrupt for key input to the MPU. The key-input device KEY has an input button or a touch sensor, for example.

Figure 2:
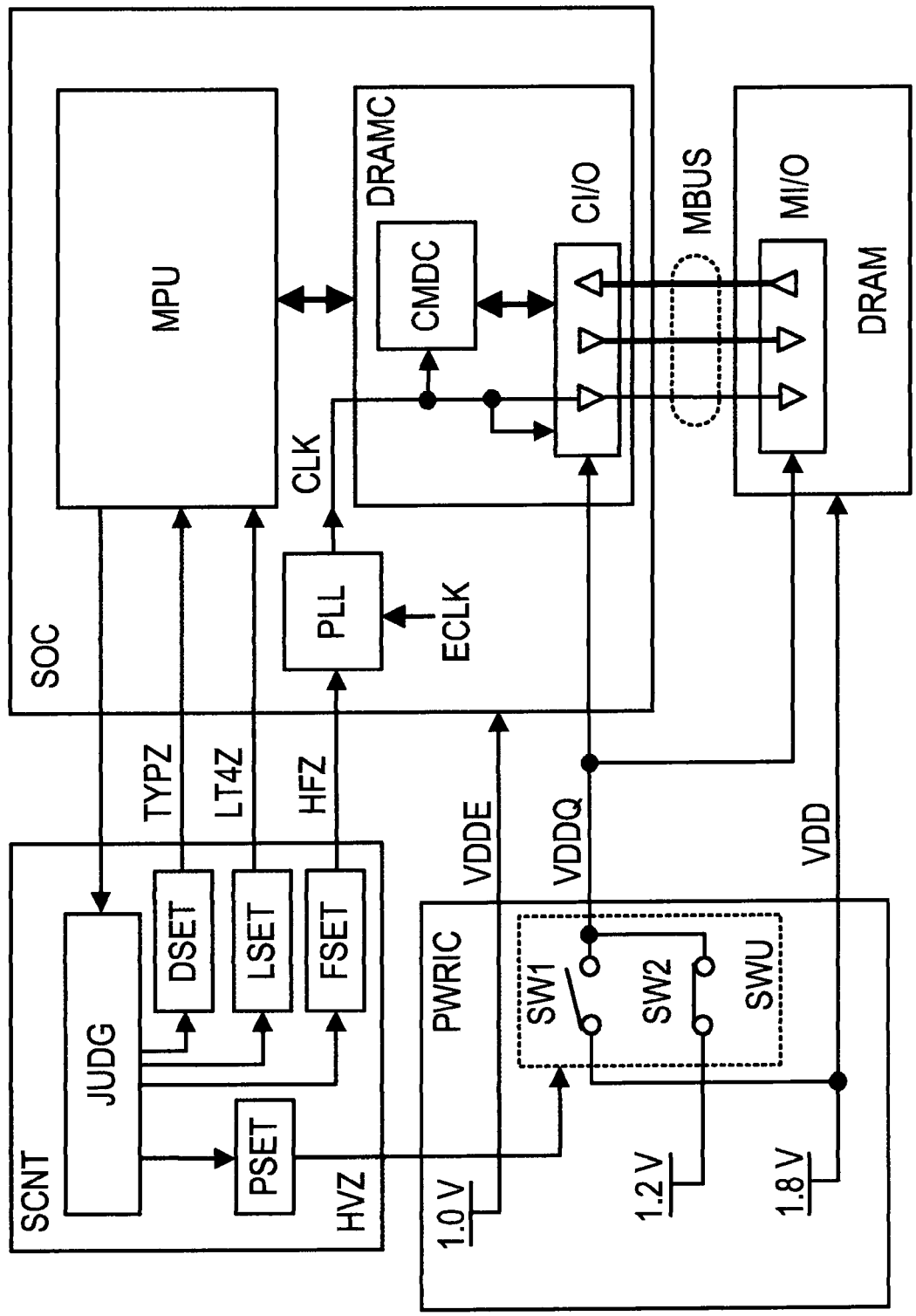
FIG. 2 shows a first embodiment.

FIG. 2 shows the substantial part of the first embodiment. The system controller SCNT includes a judgment unit JUDG, a power supply setting unit PSET, a driver setting unit DSET, a latency setting unit LSET and a frequency setting unit FSET. The judgment unit JUDG changes the setting values of each setting unit PSET, DSET, LSET and FSET based on the access state of the DRAM input from the MPU. The judgment unit JUDG may read the register value of the MPU to obtain the access state of the DRAM. The access state of the DRAM, for example, represents the frequency of access to the DRAM and data transfer rate which are required for the operation of the system device SYS.

Based on the setting value HVZ of the power supply setting unit PSET, the power supply voltages VDDQs of the input/output circuit CI/O for the memory controller DRAMC and the input/output circuit MI/O for the DRAM are changed. The input/output circuits CI/O and MI/O are coupled through the memory bus MBUS. Based on the setting value TYPS of the driver setting unit DSET, the driving capability of the input/output circuit MI/O for the DRAM is changed. The driving capability of the input/output circuit CI/O for the memory controller DRAMC may be changed, in addition to the input/output circuit MI/O. Based on the setting value LT4Z of the latency setting unit LSET, the read latency of the DRAM is changed. Based on the setting value HFZ of the frequency setting unit FSET, the frequency of the clock signal CLK, which is supplied to the memory controller DRAMC and the DRAM, is changed.

The system controller SCNT generates a voltage adjustment signal HVZ, a driver adjustment signal TYPZ, a latency adjustment signal LT4Z and a clock adjustment signal HFZ, in order to optimize the power consumption of the DRAM, according to the access state of the DRAM by the MPU, the DMAC and the memory controller DRAMC.

The power supply controller PWRIC has a switch unit SWU for supplying different power supply voltage VDDQ to a power supply line VDDQ. The switch unit SWU includes switches SW1 and SW2. When a setting value HVZ of a low level is supplied, the switch SW1 is turned off, and the switch SW2 is turned on. The power supply controller PWRIC outputs a voltage of 1.2 V, for example, to the power supply line VDDQ. When a setting value HVZ of a high level is supplied, the switch SW1 is turned on, and the switch SW2 is turned off. The power supply controller PWRIC outputs voltage of 1.8 V, for example, to the power supply line VDDQ.

The switch SW1 outputs a relatively high power supply voltage VDDQ (1.8 V). The switch SW2 outputs a relatively low power supply voltage VDDQ (1.2 V). The power supply controller PWRIC outputs voltage of 1.0 V to the power supply line VDDE, and outputs voltage of 1.8 V to the power supply line VDD. The voltage supplied to each power supply line VDDQ, VDDE and VDD is not limited to the values described above, as long as the amplitude relationship is satisfied.

In addition to the elements shown in FIG. 1, the system-on-chip SOC includes a phase locked loop (PLL) circuit, which receives an external clock signal ECLK to generate a clock signal CLK. The external clock signal ECLK may be generated within the system-on-chip SOC, or supplied from an oscillating circuit on a system board on which the system-on-chip SOC is mounted. The PLL circuit outputs a low-frequency clock signal CLK 50 MHz) when a setting value HFZ having the low level is supplied, and outputs a high-frequency clock signal CLK (e.g., 100 MHz) when a setting value HFZ of the high level is supplied. The MPU outputs to the memory controller DRAMC, a command signal for setting a mode register (shown in FIG. 5) of the DRAM according to the setting values TYPZ and LT4Z, which are set to change the driving capability and the latency of the input/output circuit MI/O, based on an operation mode judged by the judgment part JUDG.

The memory controller DRAMC includes a command control circuit CMDC and an input/output circuit CI/O, which operate in synchronization with a clock signal CLK. The input/output circuit CI/O outputs a clock signal CLK, a command signal, a write data signal or the like to the DRAM via an output buffer (delta symbol in FIG. 2), and receives a read data signal or the like from the DRAM via the input buffer (delta symbol in FIG. 2). The input/output circuit CI/O for the memory controller DRAMC and the input/output circuit MI/O for the DRAM operate upon reception of a power supply voltage VDDQ. The memory controller DRAMC accesses the memory core and mode register of the DRAM according to the command signal from the MPU.

FIG. 3 shows the operation mode of the DRAM. The DRAM has five operation modes MD1 to MD5, in which at least one of power consumption PWR and access time tAC is different. The power consumption PWR includes charging/discharging current to the memory bus MBUS, caused by the operation of the input/output circuit MI/O shown in FIG. 2. The lower the last number of the operation mode MD, the larger the power consumption PWR is. The power consumption PWR is significantly reduced by reducing the power supply voltage VDDQ supplied to the input/output circuits MI/O and CI/O. Further, the power consumption PWR is also reduced by reducing the frequency of the clock CLK.

In the first embodiment, power supply voltage VDD is constant, and internal power supply voltage VII supplied to the internal circuit of the DRAM is also constant. In all the operation modes MD1 to MD5, operation timing of a clock asynchronous circuit in the DRAM is not changed, thus malfunctions of the DRAM caused by a change in the operation modes MD1 to MD5 can be prevented. The reduction in an operating margin of a memory core 30 shown in FIG. 5 can be prevented. For example, an operating margin is data read margin by a sense amplifier SA, and data hold margin (data hold time) of a memory cell MC. The clock asynchronous circuit is a combinational circuit disposed between clock synchronous circuits.

When setup time and hold time of an input signal to the clock signal have margins, the clock synchronous circuit does not malfunction based on a change in the frequency of the clock signal. Thus, the operating margin of the internal circuit (especially, a peripheral control circuit for operating the memory core 30) in the DRAM does not reduce based on a change in the operation modes MD1 to MD5.

The system controller SCNT shown in FIG. 2 recognizes the data transfer rate of the DRAM based on the information from the MPU. The system controller SCNT sets setting values HVZ, TYPZ, LT4Z and HFZ to the setting units PSET, DSET, LSET and FSET respectively so that the power consumption of the DRAM reaches the minimum value at which the data transfer rate can be maintained.

The data transfer rate represents the total of the writing amount of data and reading amount of data per unit time, and changes based on the access frequency, clock frequency, or latency of the DRAM. When the system device SYS is a game machine, for example, the operation mode MD1 represents a state in which a fast-moving motion picture is displayed on an LCD, or a state in which a plurality of windows displaying a plurality of motion pictures are displayed on the LCD. The operation mode MD2 represents a state in which a slow-moving motion picture is displayed on the LCD. The operation mode MD3 represents a state in which a plurality of still images are displayed on the LCD repeatedly. The operation mode MD4 represents a state in which the screen of the LCD is switched according to entries from the key-input device KEY. The operation mode MD5 represents a state in which a game is paused, or a state in which an entry from the key-input device KEY is being waited. The system controller SCNT may determine the operation modes MD1 to MD5. Alternatively, the MPU may notify the system controller SCNT of information, which represents operation modes MD1 to MD5 (operating state).

In the operation mode MD1, the setting values HVZ, HFZ, LT4Z and TYPZ are set to the high level. The power supply voltage VDDQ is set to 1.8 V, the frequency of the clock signal CLK is set to 100 MHz (10 ns for clock cycle tCK), the latency LAT (read latency) is set to "4", and the driving capability DRV of the input/output circuits MI/O and CI/O is set to typical (TYP). At this time, current consumption IDD (operating current) of the DRAM is 100 mA, and the access time tAC is 6 ns. Access time tAC is time from the rising edge of a clock signal CLK until the data is outputted. Power consumption PWR is 180 mW. The tAC/tCK indicating a data reception margin by the memory controller DRAMC is 0.6. The data reception margin, for instance, represents the setup time for the read data from the DRAM with respect to the rising edge of the clock signal CLK, and the smaller the value is, the larger the margin is.

In the operation mode MD2, the setting value HVZ is set to the low level, and the setting values HFZ, LT4Z and TYPZ are set to the high level. The power supply voltage VDDQ is set to 1.2 V, the frequency of the clock signal CLK is set to 100 MHz, the latency LAT is set to "4", and the driving capability DRV of the input/output circuits MI/O and CI/O is set to typical (TYP). At this time, consumption current IDD of the DRAM is 67 mA, and the access time tAC is 10 ns. Consumption power PWR is 80 mW. Since the power supply voltage VDDQ is lower than that of the operation mode MD1, the driving capability of transistors for the input/output circuit MI/O and CI/O is lowered. Therefore, the data reception margin tAC/tCK becomes lower than that of the operation mode MD1 (=1.0).

In the operation mode MD3, the setting values HVZ and HFZ are set to the low level, and the setting values LT4Z and TYPZ are set to the high level. The power supply voltage VDDQ is set to 1.2 V, the frequency of the clock signal CLK is set to 50 MHz (20 ns for clock cycle tCK), the latency LAT is set to "4", and the driving capability DRV of the input/output circuits MI/O and CI/O is set to typical (TYP). At this time, consumption current IDD of the DRAM is 60 mA, and the access time tAC is 10 ns. Consumption power PWR is 72 mW. Since the clock cycle tCK is longer than that of the operation mode MD2, the data reception margin tAC/tCK is higher than that of the operation mode MD2 (=0.5).

In the operation mode MD4, the setting values HVZ, HFZ and LT4Z are set to the low level, and the setting value TYPZ is set to the level. The power supply voltage VDDQ is set to 1.2 V, the frequency of the clock signal CLK is set to 50 MHz, the latency LAT is set to "2", and the driving capability DRV of the input/output circuits MI/O and CI/O is set to typical (TYP). At this time, consumption current IDD of the DRAM is 50 mA, and the access time tAC is 10 ns. In the operation mode MD4, since the latency LAT is small, the period of time from the read command to the output of the read data is shortened. Since an activation period of the memory core 30 is relatively reduced, the consumption power PWR becomes lower than that of the operation mode MD3 (=60 mW). The data reception margin tAC/tCK is 0.5.

In the operation mode MD5, all the setting values HVZ, HFZ, LT4Z and TYPZ are set to the low level. The power supply voltage VDDQ is set to 1.2 V, the frequency of the clock signal CLK is set to 50 MHz, the latency LAT is set to "2", and the driving capability DRV of the input/output circuits MI/O and CI/O is set to strong (STG). At this time, consumption current IDD of the DRAM is 50 mA, and the access time tAC is 6 ns. Since the latency LAT is lower, as in the operation mode MD4, the consumption power PWR becomes lower than that of the operation mode MD3 (=60 mW). Since the driving capability DRV of the input/output circuits MI/O and CI/O is set to strong (STG), the access time tAC is shortened, therefore, the data reception margin tAC/tCK becomes higher than that of the operation modes MD3 and MD4 (=0.3). By setting the driving capability DRV to strong (STG), current, which flows through a transistor and reduced based on the low power supply voltage VDDQ, is compensated.

In the operation modes MD1 to MD5, the level of any one of the setting values HVZ, HFZ, LT4Z and TYPZ is reversed, and the power consumption of the DRAM is optimized according to the operating state of the system device SYS. The operation mode can be set by skipping some operation modes such as from MD1 to MD5, or MD4 to MD2.

Figure 4:
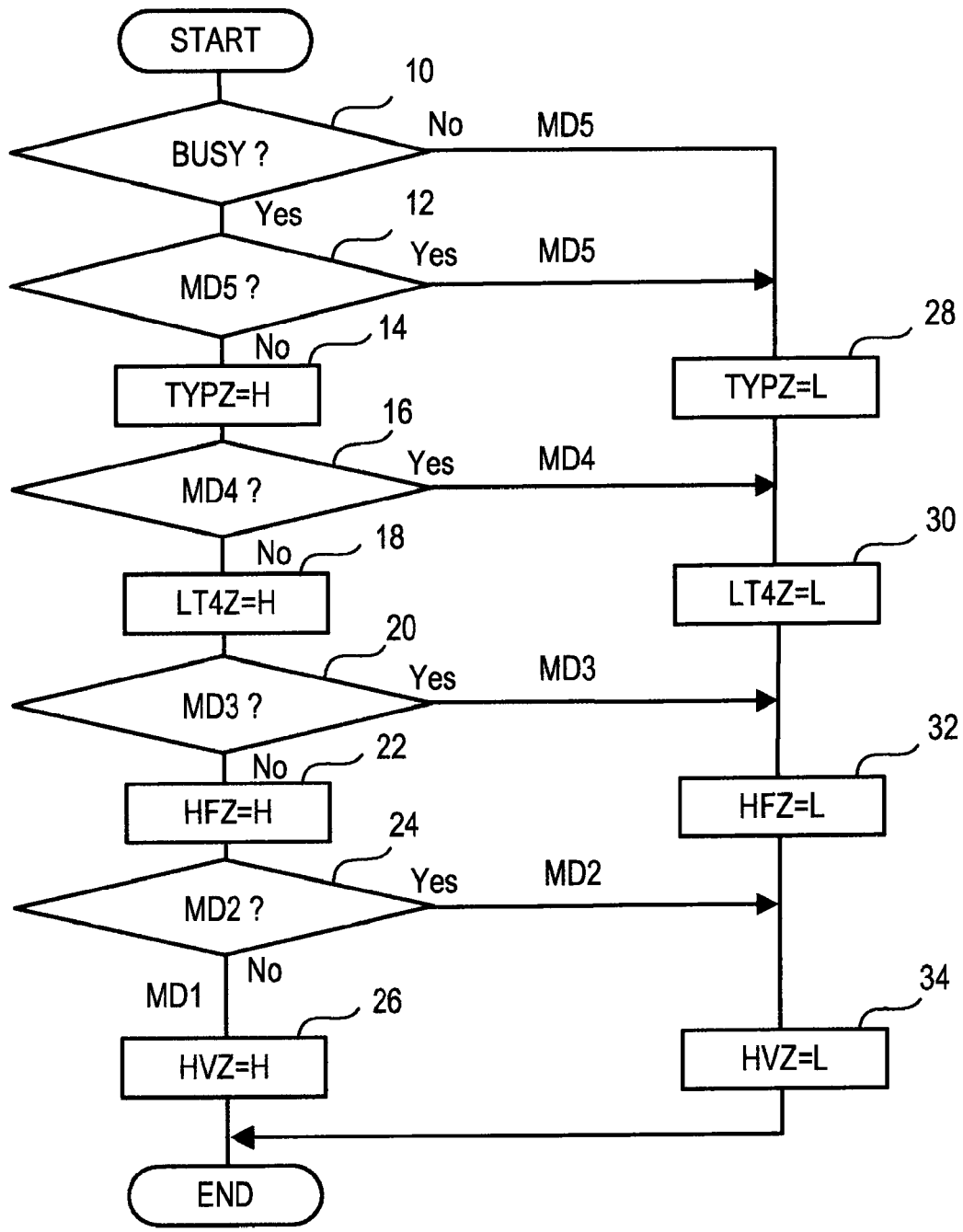
FIG. 4 shows a control method for the DRAM.

FIG. 4 shows the control method for the DRAM. Control shown in FIG. 4 is achieved by hardware including the system controller SCNT, or by a program executed by the system controller SCNT. The program is stored in a built-in ROM (not shown) of the system controller SCNT. When the control shown in FIG. 4 is achieved by the MPU, the program executed by the MPU is stored in the flash memory FLASH. The program stored in the flash memory FLASH is transferred to the DRAM or a work RAM (not shown) on the SOC at power-on of the system device SYS.

Every time the MPU internally notifies the operating state of the system device SYS (operation mode MD of the DRAM) to the system controller SCNT, the flow shown in FIG. 4 is performed. Alternatively, every time the system controller SCNT reads (it may read at regular intervals) the register of the MPU in which the operating state (operation mode MD of the DRAM) of the system device SYS is stored, the flow shown in FIG. 4 is performed.

In the operation 10, the system controller SCNT determines whether or not the system device SYS is busy (BUSY). When the system device SYS is busy (when the DRAM is accessed), this process goes to the operation 12. When the system device SYS is not busy, since the system controller SCNT sets the operation mode of the DRAM to MD5, the process goes to the operation 28. In the operation 28, since the system controller SCNT sets the driving capability DRV of the input/output circuit MI/C to strong (STG), the setting value TYPZ is set to the low level. After the operation 28, the operations 30, 32 and 34 are sequentially performed in order to set the operation mode to MD5.

In the operation 12, the system controller SCNT determines whether or not the operation mode of the DRAM should be set to MD5. When the operation mode is set to MD5, the process goes to the operation 28. When the operation mode is not set to MD5, the process goes to the operation 14 in order to set the operation mode to MD1. In the operation 14, the setting value TYPZ is set to the high level in order to set the driving capability DRV of the input/output circuit MI/O to typical (TYP).

In the operation 16, the system controller SCNT determines whether or not the operation mode of the DRAM should be set to MD4. When the operation mode is set to MD4, the process goes to the operation 30. In the operation 30, the setting value LT4Z is set to the low level in order to set the latency LAT to "2". Thereafter, the operations 32 and 34 are sequentially processed in order to set the operation mode of the DRAM MD4. When the operation mode is not set to MD4, the process goes to the operation 18 in order to set the operation mode to any one of MD1 to MD3. In the operation 18, the setting value LT4Z is set to the high level in order to set the latency LAT to "4".

In the operation 20, the system controller SCNT determines whether or not the operation mode of the DRAM should be set to MD3. When the operation mode is set to MD3, the process goes to the operation 32. In the operation 32, the setting value HFZ is set to the low level in order to set the frequency of the clock signal. CLK to 50 MHz. Thereafter, the operation 34 is processed in order to set the operation mode of the DRAM to MD3. When the operation mode is not set to MD3, the process goes to the operation 22 in order to set the operation mode to either of MD1 or MD2. In the operation 22, the setting value HFZ is set to the high level in order to set the frequency of the clock signal CLK to 100 MHz.

In the operation 24, the system controller SCNT determines whether or not the operation mode of the DRAM should be set to MD2. When the operation mode is set to MD2, the process goes to the operation 34. In the operation 34, the setting value HFZ is set to the low level in order to set the power supply VDDQ to 1.2 V. The operation mode of the DRAM is set to any one of MD2 to MD5. When the operation mode is not set to MD2, the process goes to the operation 26 in order to set the operation mode to MD1. In the operation 26, the setting value HFZ is set to the high level in order to set the power supply VDDQ to 1.8 V.

FIG. 5 shows an example of the DRAM. A double-rectangle symbol in FIG. 5 represents an external terminal. The external terminal is, for example, a pad on a semiconductor chip, or a lead of a package in which the semiconductor chip is housed. The same reference symbols as those for terminals are attached to signals which are transmitted via external terminals. The DRAM is, for example, an SDRAM operating in synchronization with the clock signal CLK.

The DRAM includes a clock input buffer 10, a command input buffer 12, a command decoder 14, a mode register 16, a core control circuit 18, a voltage generating circuit 20, an address input buffer 22, a burst address generating circuit 23, a latency counter 24, a data input buffer 26, a data output buffer 28 and a memory core 30. The clock input buffer 10, the command input buffer 12, the address input buffer 22, the data input buffer 26 and the data output buffer 28 correspond to, for example, the input/output circuit MI/O shown in FIG. 2, and operate when the power supply voltage VDDQ is supplied.

The DRAM has a refresh timer for periodically generating an internal refresh request in order to periodically perform refresh operation in a self-refresh mode, and a refresh address counter (not shown) for generating a refresh address signal indicating a memory cell to be refreshed.

The clock input buffer 10 received a clock signal and outputs an internal clock signal. The internal clock signal ICLK is supplied to a circuit operating in synchronization with the clock. The clock input buffer 10 may be controlled by a clock enable signal CKE. The command input buffer 12 receives a command signal CMD (chip select signal/CS, row address strobe signal/RAS, column address strobe signal/CAS, write enable signal/WE, and the like) in synchronization with the internal clock signal ICLK, and outputs the received command signal CMD to a command decoder 14.

The command decoder 14 outputs the command signal CMD as an active command signal ACTZ for performing access operation of the memory core 30, a read command signal RDZ, a write command signal WRZ, a refresh command signal REFZ, or a mode register setting command signal MRSZ for setting a mode register 16.

The mode register 16 has a plurality of registers, which are set by receiving a row address signal RAD, for example, in synchronization with the mode register setting command signal MRSZ. The DRAM operates in an operation mode set in a register. For example, the mode register 16 keeps a latency register, which keeps a setting value LT4Z for setting the latency LAT shown in FIG. 2 and outputs it as a latency signal LT4MZ, a drive register, which keeps a setting value TYPZ for setting the driving capability DRV of the input/output circuit MI/O and outputs it as a typical signal TYPMZ, and a burst register, which keeps a setting value for setting a burst length BL. The latency LAT is the number of clock cycles since a read command has been received until the read data DQ has started to be outputted. The burst length is the number of outputs of data signals outputted from the data terminal DQ in response to one read command, and the number of inputs of data signals received by the data terminal DQ in response to one write command. The mode register 16 outputs the burst signal BL1 indicating the set burst length BL to the burst address generating circuit 23.

The core control circuit 18 outputs a control signal CNT for controlling the access operation (read operation, write operation, or refresh operation) of the memory core 30 in response to the active command signal ACTZ, the read command signal RDZ, the write command signal WRZ, or the refresh command signal REFZ. The control signal CNT includes a timing signal for pre-charging a bit line BL and /BL, a timing signal for activating a word line WL, a timing signal for activating a sense amplifier SA, and the like. Based on the active command, the word line WL selected by the row address signal RAD is activated. Based on the read command, data is read from a memory cell MC selected by the row address signal RAD and the column address signal CAD. Based on the write command, data is written into a memory cell MC selected by the row address signal RAD and the column address signal CAD. Based on the refresh command, the memory cell MC coupled to a word line WL selected by the refresh address signal is refreshed.

When power supply voltage VDD (e.g., 1.8 V) is received, the voltage generating circuit 20 generates internal power supply voltage VII (e.g., 1.6 V). The internal power supply voltage VII is constant voltage, which does not depend on fluctuation in power supply voltage VDD, and is supplied to a circuit (internal circuit) except for the input/output circuit MI/O. For example, the internal circuit includes the command decoder 14, the mode register 16, the core control circuit 18, the voltage generating circuit 20, the latency counter 24 and the memory core 30.

The address input buffer 22 receives a row address signal RAD and a column address signal CAD in time-division fashion at an address terminal AD in order to select a memory cell MC to be accessed. The row address signal RAD is supplied in synchronization with a row address strobe signal/ RAS in order to select a word line WL. The column address signal CAD is supplied in synchronization with a column address strobe signal/CAS in order to select a bit line pair BL and /BL.

The burst address generating circuit 23 sequentially generates column addresses subsequent to the column address CAD (start address) received at the address terminal AD, in synchronization with the internal clock signal ICLK, based on the burst signal BL1 indicating the burst length BL during burst read operation or burst write operation. The burst address generating circuit 23 outputs the column address CAD and the generated column address to the column decoder CDEC as internal column addresses ICADs. For example, when the burst length BL is "4", the burst address generating circuit 23 generates three column addresses subsequent to the column address CAD.

The latency counter 24 activates a data output timing signal DOUTZ at timing based on the latency signal LT4MZ, in response to the read command signal RDZ. The activation period of the data output timing signal DOUTZ represents the operation period of the data output buffer 28.

The data input buffer 26 receives a write data signal to be supplied to the data terminal DQ (e.g., 16 bit) in synchronization with the internal clock signal ICLK, and outputs the received data signal to the data bus DB. The data output buffer 28 receives the read data to be read from the memory cell MC through the data bus DB, and outputs the read data to the data terminal DQ in synchronization with the internal clock signal ICLK during the activation of the data output timing signal DOUTZ.

The memory core 30 includes, for example, a pair of row blocks RBLK, a row decoder RDEC corresponding to each row block RBLK, a sense amplifier area SAA located between the row blocks RBLKs, a column decoder CDEC, a read amplifier RA, and a write amplifier WA. The number of the row blocks RBLKs is four (4), eight (8), or sixteen (16). The sense amplifier area SAA has a pre-charging circuit PRE and a connection switch BT, which correspond to each row block RBLK, and a sense amplifier SA and a column switch CSW which are shared by the row block RBLK. The connection switch BT selectively couples the bit line pair BL, /BL of each row block RBLK to the sense amplifier SA.

The column decoder CDEC decodes the column address signal CAD in order to select the number of the bit line pairs BL, /BL corresponding to the bit number of the data terminal DQ. The read amplifier RA amplifies complementary read data, which is to be outputted through a column switch CSW during read operation. The write amplifier WA amplifies complementary write data, which is to be supplied through the data bus DB during write operation, and supplies the data to the bit line pair BL, /BL.

Figure 6:
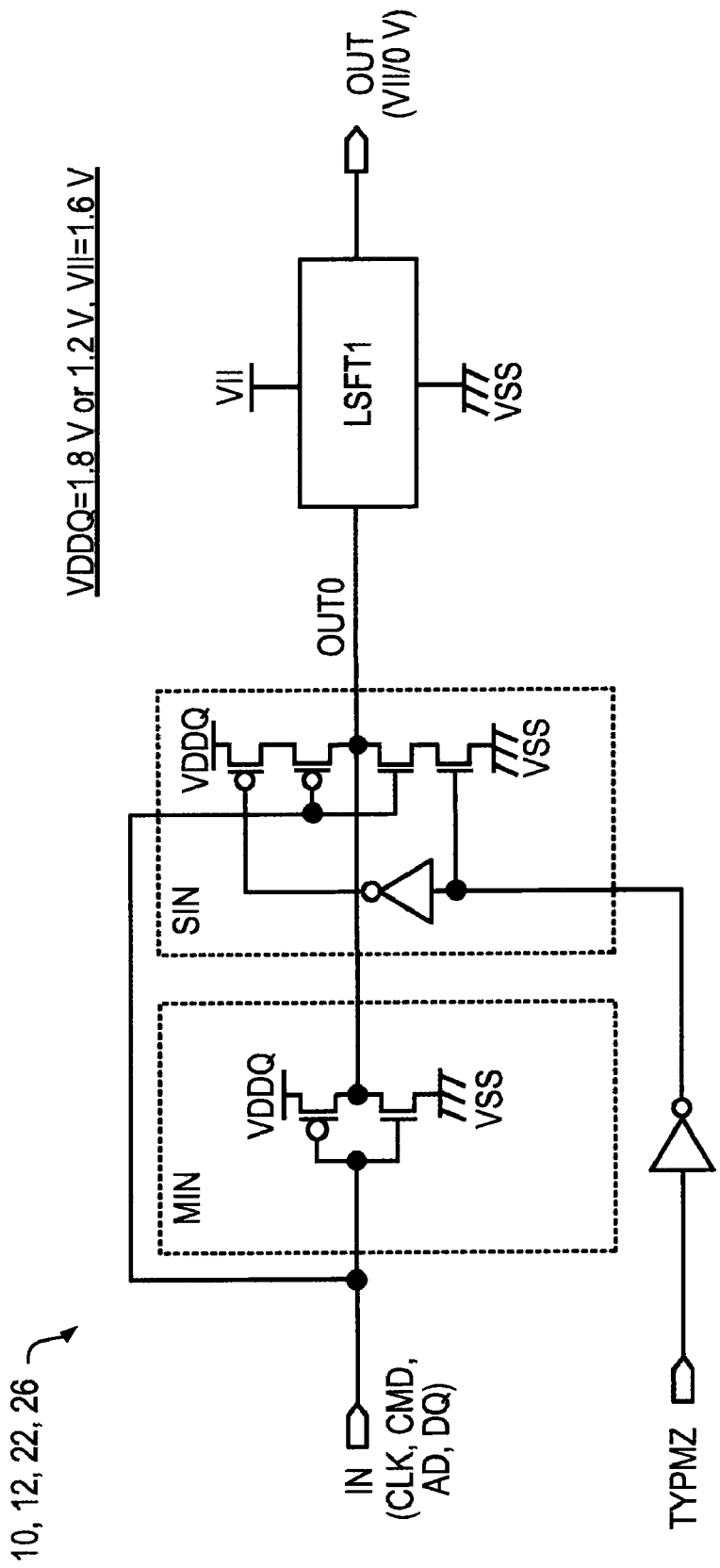
FIG. 6 shows an input buffer.

FIG. 6 shows an input buffer. Although FIG. 6 represents the data input buffer 26 of FIG. 5, the other input buffers 10, 12 and 22 in FIG. 5 are the same.

The data input buffer 26 includes a main input buffer MIN, a sub input buffer SIN and a level shifter LSFT1. The main input buffer MIN and the sub input buffer SIN are coupled in parallel with each other between an input node IN and an output node OUT0. The main input buffer MIN is a CMOS inverter, and the high-level power supply terminal thereof is coupled to a power supply line VDDQ, and the low-level power supply terminal thereof is coupled to a ground VSS. The main input buffer MIN operates regardless of the logic level of a typical signal TYPMZ.

The sub input buffer SIN is a clocked CMOS inverter, which is controlled by a typical signal TYPMZ, and the high-level power supply terminal thereof is coupled to a power supply line VDDQ, and the low-level power supply terminal thereof is coupled to a ground VSS. The CMOS inverter includes a pMOS transistor (circle symbol is put to its gate) and an nMOS transistor.

The threshold voltage of PMOS transistor for the sub input buffer SIN is the same as that of the pMOS transistor for the main input buffer MIN. The threshold voltage of nMOS transistor for the sub input buffer SIN is the same as that of the nMOS transistor for the main input buffer MIN. However, the threshold voltage of pMOS transistor for the sub input buffer SIN may be lower than that of the pMOS transistor for the main input buffer MIN. Alternatively, the threshold voltage of nMOS transistor for the sub input buffer SIN may be lower than that of the nMOS transistor for the main input buffer MIN. In this manner, when the sub input buffer SIN operates, the driving capability of the input buffers 10, 12, 22 and 26 is increased.

The sub input buffer SIN operates while receiving a typical signal TYPMZ at the low level, reverses the input signal IN, and outputs the reversed input signal IN as an output signal OUT0. The sub input buffer SIN stops operating while receiving a typical signal TYPZ at the high level. When the typical signal TYPMZ is at the low level, the driving capability DRV of the clock input buffer 10 becomes relatively high (STG in FIG. 3). When the typical signal TYPMZ is at the high level, the driving capability DRV of the clock input buffer 10 becomes relatively low (TYP in FIG. 3).

The level shifter LSFT1 converts the high-level output signal OUT0 (1.8 V or 1.2 V) into an internal power supply voltage VII (1.6 V), and outputs it to the internal circuit of the DRAM as an output signal OUT. Especially, when the power supply voltage VDDQ is 1.2 V, the high-level output signal OUT is set to 1.6 V, thus the pMOS transistor, such as a COMS inverter or the like, coupled to the output terminal OUT can be reliably turned off and leak current is eliminated.

Figure 7:
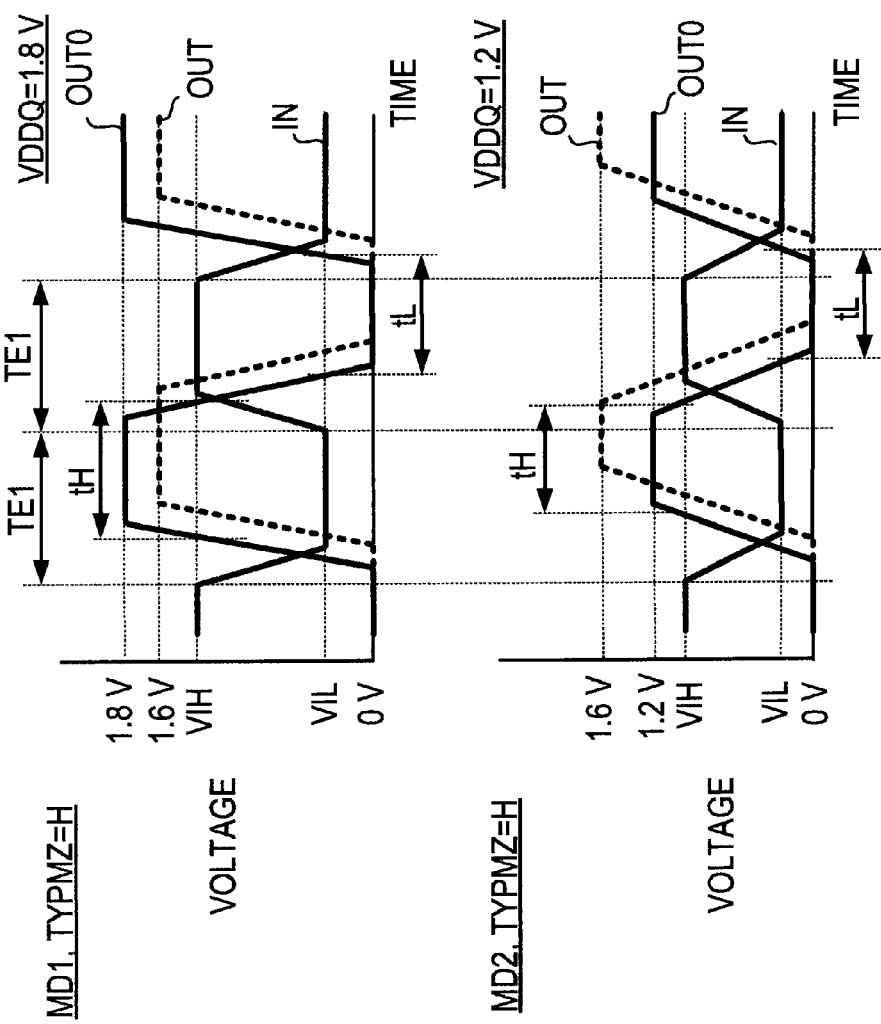
FIG. 7 shows an operation of the input buffer.
Figure 13:
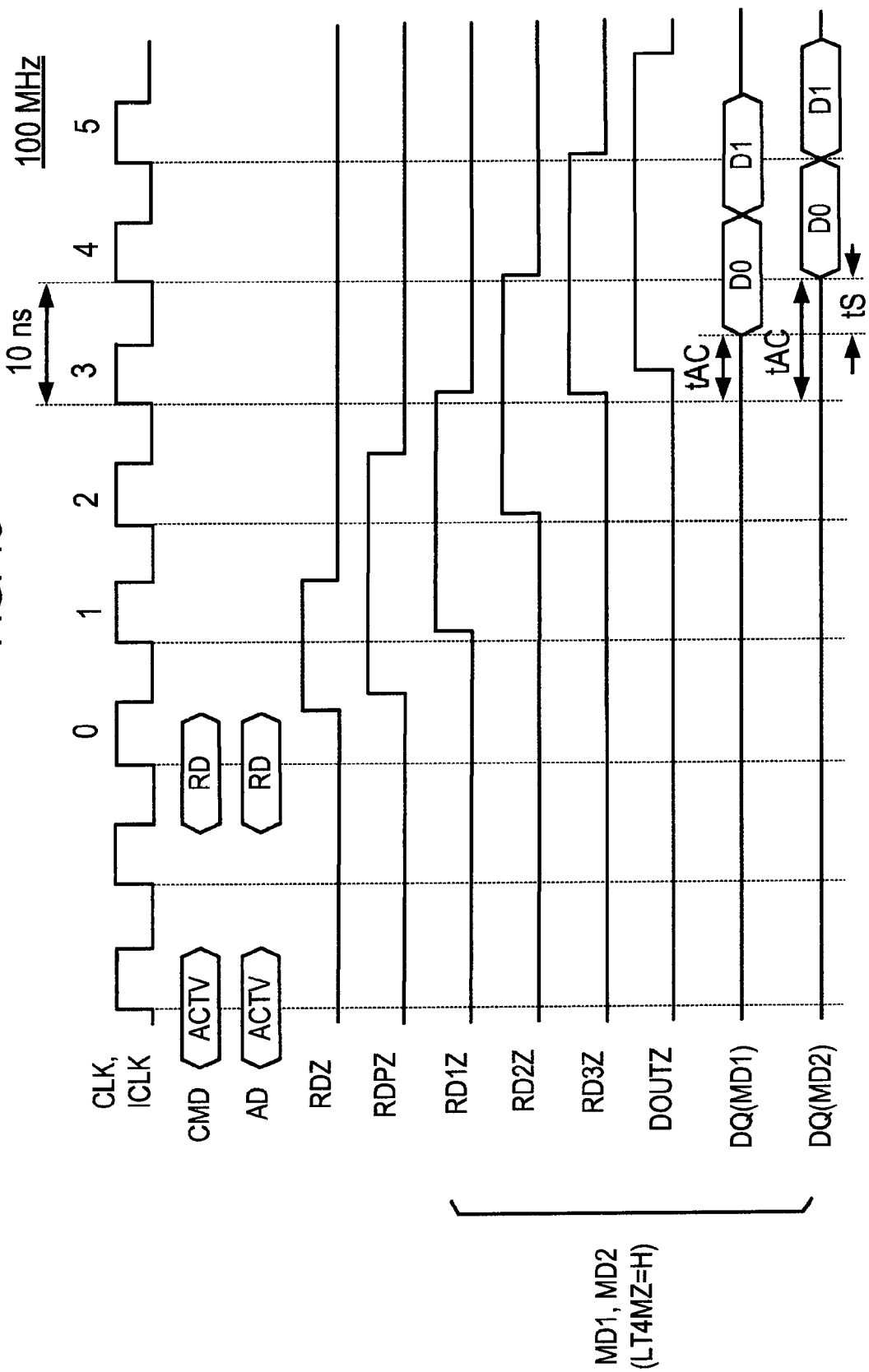
FIG. 13 shows a read operation from the DRAM.

FIG. 7 shows the operation of the input buffers 10, 12, 22 and 26 shown in FIG. 6 in the operation modes MD1 to MD2. The VIH of FIG. 7 represents the minimum value of a high-level input voltage, and VIL represents the maximum value of a low-level input voltage. In the operation modes MD1 to MD2, the frequency of the clock signal CLK is 100 MHz. The minimum supply cycles of the data signal DQ, the address signal AD and the command signal CMD are equal to one cycle (10 ns) of a clock signal CLK, as shown in FIG. 13. In the input buffers 12, 22 and 26 shown in FIG. 6, the transition edge interval TE1 of an input signal IN is 10 ns. In the clock input buffer 10 shown in FIG. 6, the transition edge interval TE1 of the input signal IN (=clock signal CLK) is 5 ns.

In the operation mode MD1, the power supply voltage VDDQ is 1.8 V, therefore, the driving capability DRV of the input buffer is high. The inclination of the output signal OUT0 becomes sharp, and the high level period tH and the low level period tL for the output signals OUT0 and OUT become relatively large. Therefore, the ratios of the periods tH and tL, which define the logical level for the output signals OUT0 and OUT, over the edge interval TE1, i.e. tH/TE1 and tL/TE1 become large (increase in a slew rate). Further, since the propagation delay time of the input buffers 10, 12, 22 and 26 is reduced, for example, the margin of the setup time of the data input signal DQ becomes large.

In the operation mode MD2, the power supply voltage VDDQ is 1.2 V, therefore, the driving capability DRV of the input buffer is lower than that of the operation mode MD1. The inclination of the output signal OUT0 becomes mild, and the high level period tH and the low level period tL for the output signals OUT0 and OUT become relatively small.

Figure 8:
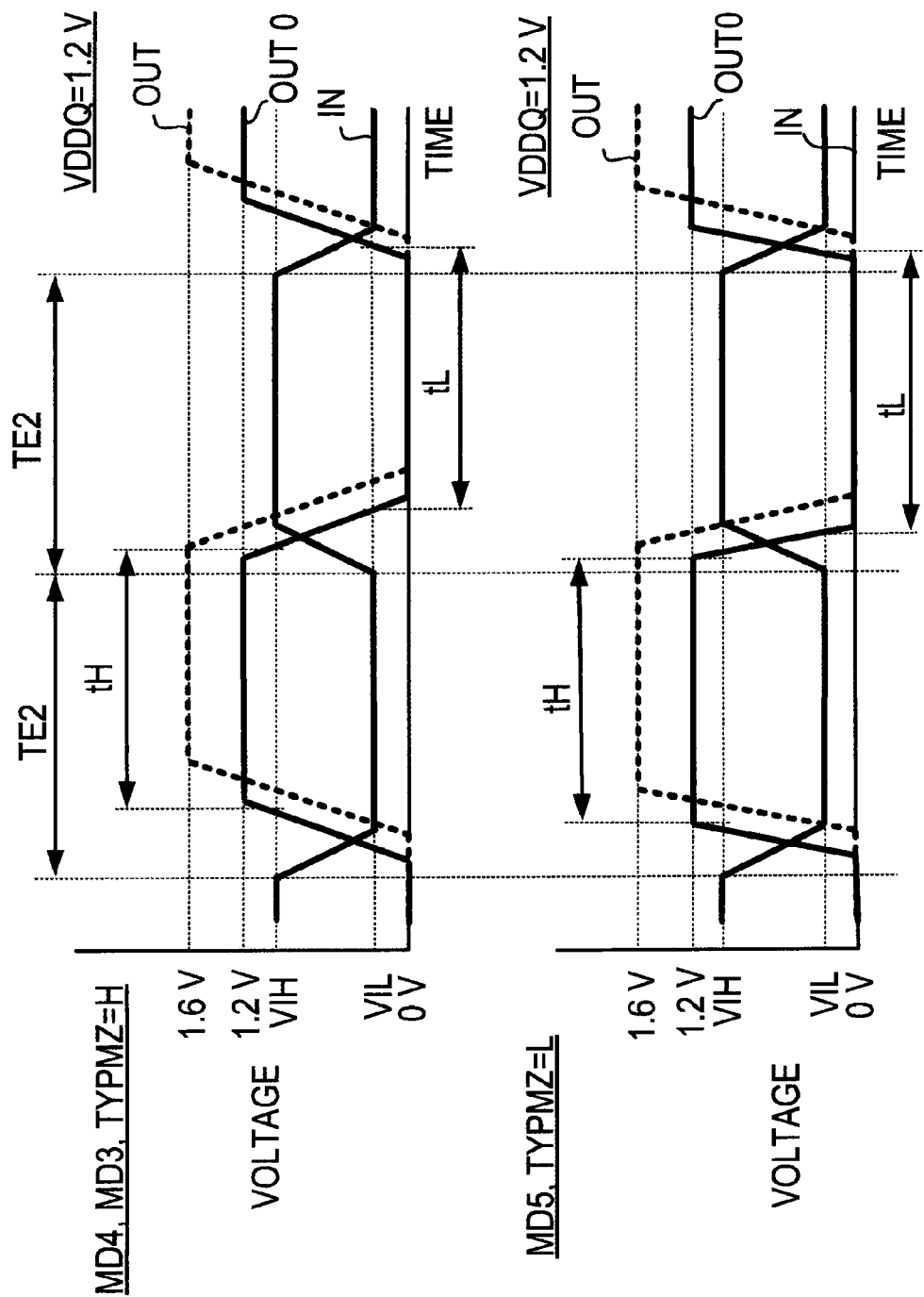
FIG. 8 shows an operation of the input buffer.

FIG. 8 shows the operation of the input buffers 10, 12, 22 and 26 shown in FIG. 6 in the operation modes MD3 to MD5. In the operation modes MD3 to MD5, the frequency of the clock signal CLK is 50 MHz. The minimum supply cycles of the data signal DQ, the address signal AD and the command signal CMD are equal to one cycle (20 ns) of a clock signal CLK, as shown in FIG. 13. In the input buffers 12, 22 and 26 shown in FIG. 6, the transition edge interval TE2 of an input signal IN is 20 ns. In the clock input buffer 10 shown in FIG. 6, the transition edge interval TE2 of the input signal IN (=clock signal CLK) is 10 ns.

In the operation modes MD3 to MD4, the typical signal TYPMZ is at the high level, and the driving capability DRV of the input buffer is low. The inclination of the output signal OUT0 becomes mild, and the high level period tH and the low level period tL for the output signals OUT0 and OUT become relatively small.

In the operation mode MD5, the typical signal TYPMZ is at the low level, and the driving capability DRV of the input buffer is high. The inclination of the output signal OUT0 becomes sharp, and the high level period tH and the low level period tL for the output signals OUT0 and OUT become relatively large. As in the mode MD1, the ratios tH/TE1 and tL/TE1 become large (increase in slew rate), and the margin of the setup time of the data input signal DQ becomes large.

Figure 9:
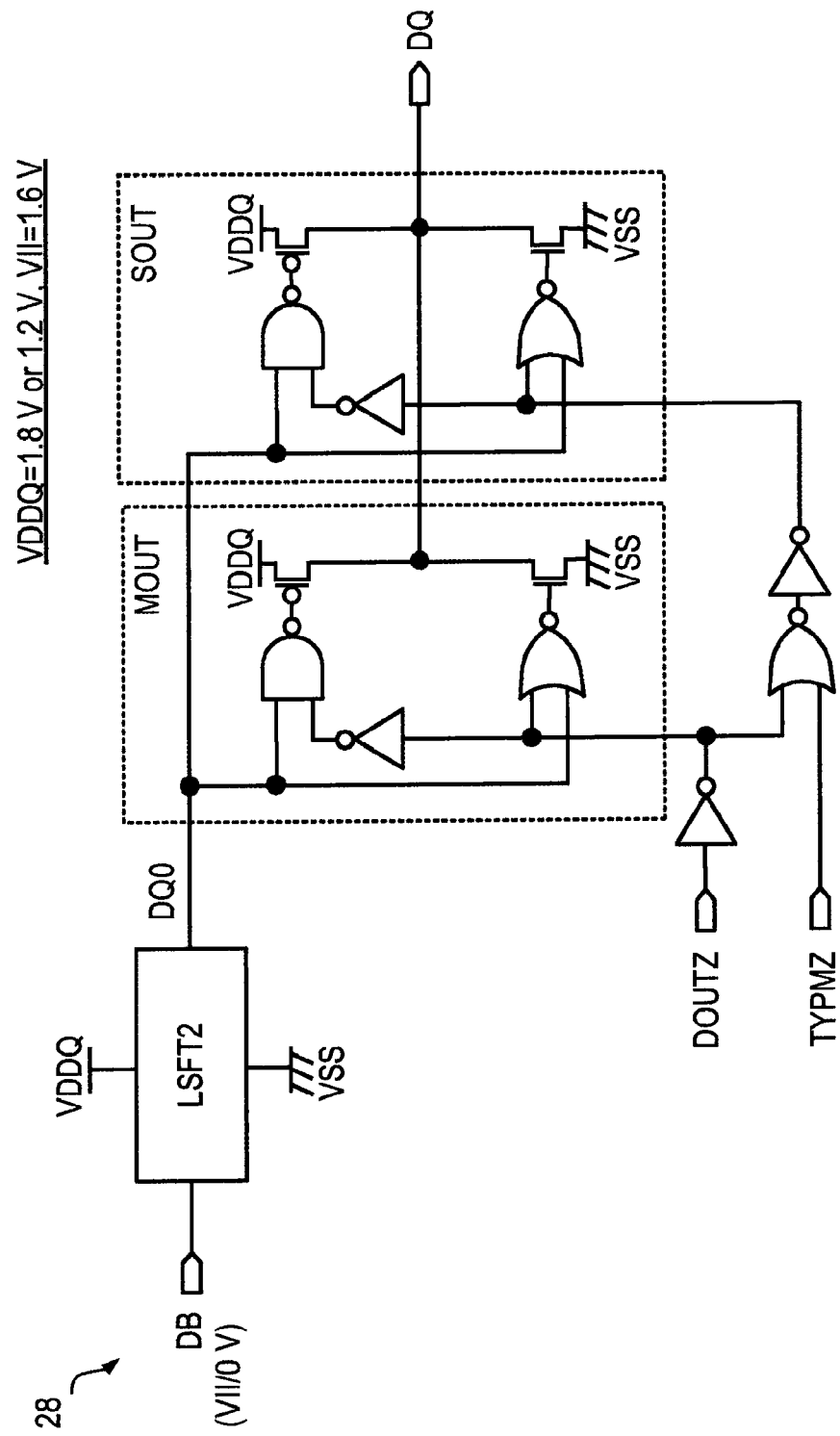
FIG. 9 shows an output buffer.

FIG. 9 shows a data output buffer. The data output buffer 28 shown in FIG. 9 has a level shifter LSFT2, a main output buffer MOUT and a sub output buffer SOUT. The main output buffer MOUT and the sub output buffer SOUT are coupled in parallel with each other between an input node DQ0 and an output node DQ.

The main output buffer MOUT is a tri-state type output buffer. The tri-state type output buffer has a pMOS transistor and an nMOS transistor, which are controlled by a NAND gate and a NOR gate, respectively, which become valid during the activation of the data output timing signal DOUTZ. The source of the pMOS transistor is coupled to the power supply line VDDQ. The source of the NMOS transistor is coupled to the ground VSS. The configuration of the sub output buffer SOUT is the same as that of the main output buffer MOUT. In the sub output buffer SOUT, the NAND gate and the NOR gate become invalid during the high-level period of the typical signal TYPMZ, and the output node enters a high impedance state. The sub output buffer SOUT is activated while receiving a typical signal TYPMZ at the low level, and outputs an input signal DQ0 as an output signal DQ. When the typical signal TYPMZ is at the low level, the driving capability DRV of the data output buffer 28 becomes relatively high (STG in FIG. 3). When the typical signal TYPMZ is at the low level, the driving capability DRV of the data output buffer 28 becomes relatively low (TYP in FIG. 3).

The threshold voltage of pMOS transistor for the sub output buffer SOUT is the same as that of the pMOS transistor for the main input buffer MIN. The threshold voltage of nMOS transistor for the sub output buffer SOUT is the same as that of the nMOS transistor for the main output buffer MOUT. However, the threshold voltage of pMOS transistor for the sub output buffer SOUT may be lower than that of the pMOS transistor for the main output buffer MOUT. Alternatively, the threshold voltage of nMOS transistor for the sub output buffer SOUT may be lower than that of the nMOS transistor for the main output buffer MOUT. In this manner, when the sub output buffer SOUT operates, the driving capability of the data output buffer 28 is increased.

Figure 10:
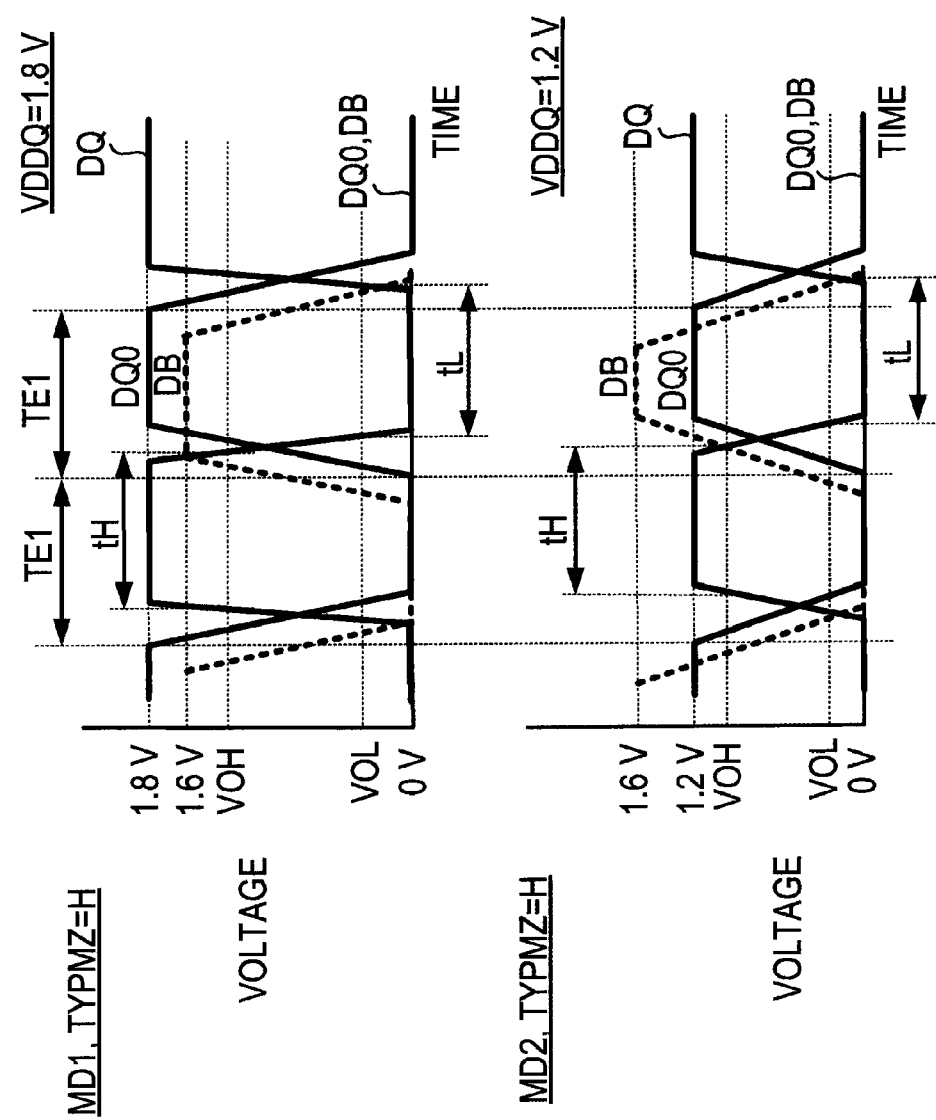
FIG. 10 shows an operation of the output buffer.

FIG. 10 shows the operation of the data output buffer 28 shown in FIG. 9 in the operation modes MD1 to MD2. The VOH of FIG. 10 represents the minimum value of high-level output voltage, and VOL represents the maximum value of low-level output voltage. In the operation modes MD1 to MD2, the frequency of the clock signal CLK is 100 MHz. The minimum output cycle of the data signal DQ is equal to one cycle (10 ns) of a clock signal CLK, as shown in FIG. 13, and the transition edge interval TE1 of an input signal DQ0 is 10 ns.

In the operation mode MD1, the power supply voltage VDDQ is 1.8 V, therefore, the driving capability DRV of the data output buffer 28 is high. The inclination of the transition edge of the output signal DQ becomes sharp, and the high level period tH and the low level period tL for the data output signal DQ become relatively large. The ratios of the periods tH and tL, which defines the logical level for the output signal DQ, over the edge interval TE1, i.e. tH/TE1 and tL/TE1 become large (increase in a slew rate). Since the propagation delay time of the data output buffer 28 is reduced, for example, as shown in FIG. 13, the setup time tS of the data output signal DQ is extended, and the access time tAC is reduced.

In the operation mode MD2, the power supply voltage VDDQ is 1.2 V, therefore, the driving capability DRV of the data output buffer 28 is lower than that of the operation mode MD1. The inclination of the transition edge of the data output signal DQ becomes mild, and the high level period tH and the low level period tL for the data output signal DQ become relatively small.

Figure 11:
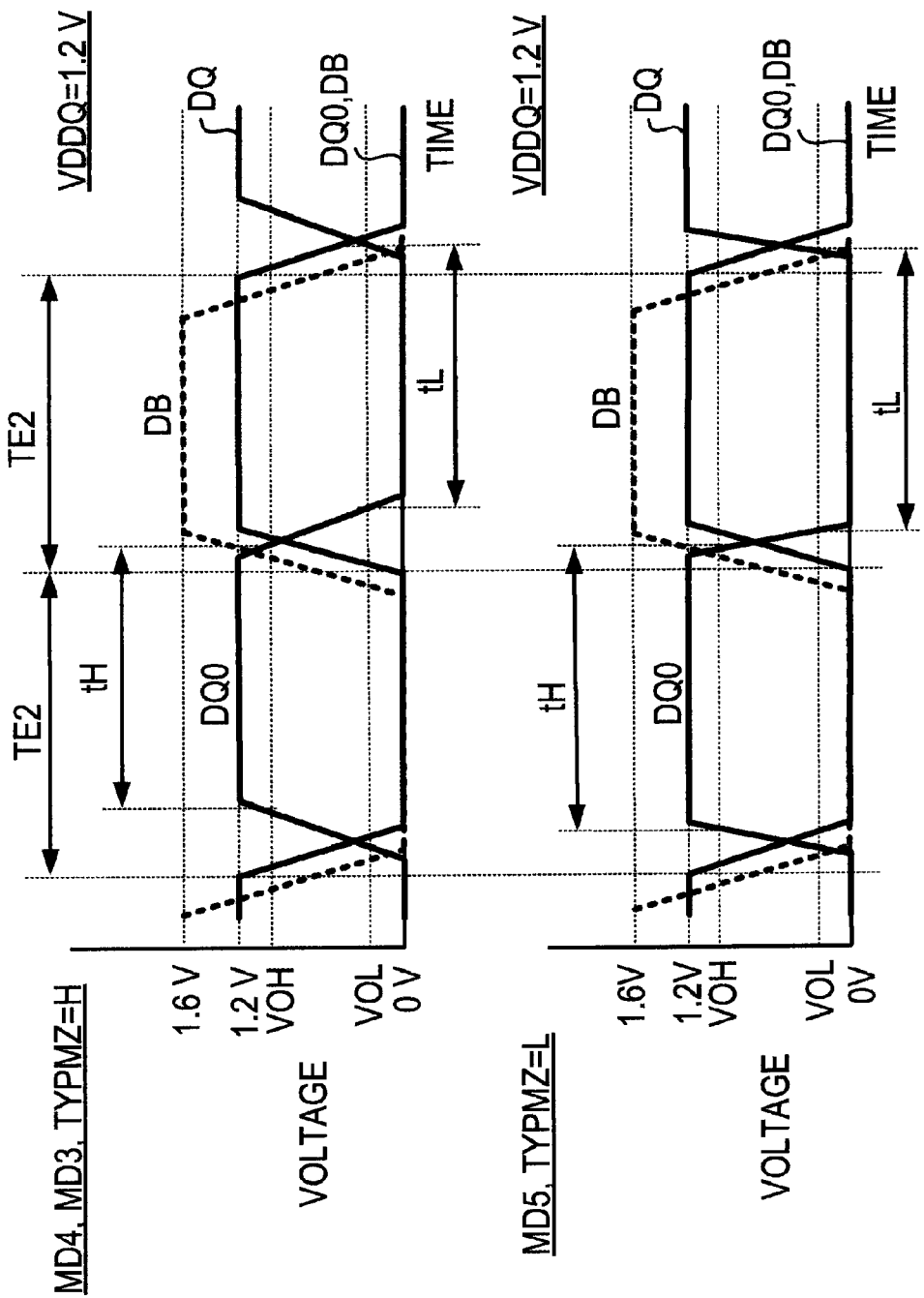
FIG. 11 shows an operation of the output buffer.

FIG. 11 shows the operation of the data output buffer 28 shown in FIG. 9 in the operation modes MD3 to MD5. In the operation modes MD3 to MD5, the frequency of the clock signal CLK is 50 MHz. The minimum output cycle of the data signal DQ is equal to one cycle (20 ns) of a clock signal CLK, as shown in FIG. 13. The transition edge interval TE2 of the input signal DQ0 is 20 ns.

In the operation modes MD3 to MD4, the typical signal TYPMZ is at the high level, and the driving capability DRV of the data output buffer 28 is low. The inclination of the transition edge of the data output signal DQ becomes mild, and the high-level period tH and the low-level period tL for the data output signal DQ become relatively small.

In the operation mode MD5, the typical signal TYPMZ is at the low level, and the driving capability DRV of the data output buffer 28 is high. The inclination of the transition edge of the data output signal DQ becomes sharp, and the high-level period tH and the low-level period tL for the data output signal DQ become relatively large. As in the mode MD1, the ratios tH/TE1 and tL/TE1 become large (increase in slew rate), the setup time of the data input signal DQ is extended, and the access time tAC is reduced.

Figure 12:
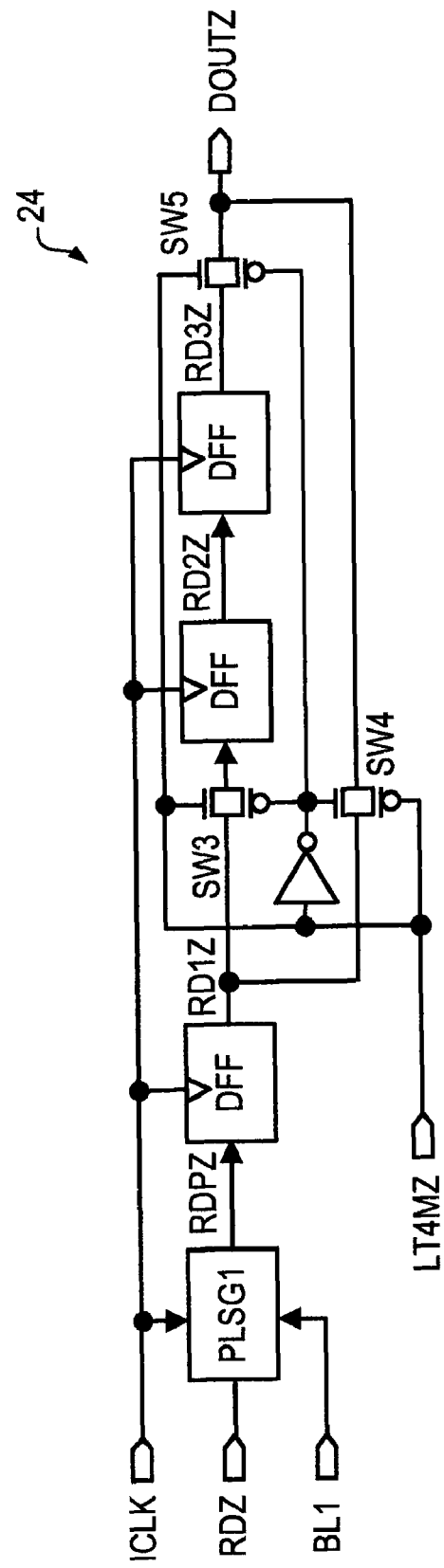
FIG. 12 shows a latency counter.

FIG. 12 shows a latency counter. A latency counter 24 shown in FIG. 12 has a pulse generator PLSG1, three flip-flops DFFs, which are coupled in serial, a switch SW3 for coupling the output of the first-stage flip-flop DFF to the input of the second-stage flip-flop DFF, a switch SW4 for coupling the output of the first-stage flip-flop DFF to an output node DOUTZ and a switch SW5 for coupling the output of the three-stage flip-flop DFF to the output node DOUTZ. Each of switches SW3 to 5 is a CMOS communication gate, for example.

The pulse generator PLSG1 extends the pulse width of the read command signal RDZ according to the burst signal BL1, which indicates the burst length from the mode register 16, and outputs the read command signal RDPZ that has the same number of pulses as the burst length. Each flip-flop DFF latches the logic of an input terminal in synchronization with the internal clock signal ICLK. The switches SW3 and SW5 are turned on while the latency signal LT4MZ is being at the high H. The switch SW4 is turned on while the latency signal LT4MZ is being at the low level. When the latency LAT is set to "4", the latency counter 24 outputs the data output timing signal DOUTZ three clocks after a read command signal RDZ is received. When the latency LAT is set to "2", the latency counter 24 outputs the data output timing signal DOUTZ one clock after a read command signal RDZ is received.

FIG. 13 shows the read operation of the DRAM shown in FIG. 5 in the operation modes MD1 to MD2. In the operation modes MD1 to MD2, the frequency of the clock signal CLK is 100 MHz, and the latency LAT is "4" (LT4MZ=High). For example, when the period of time from the active command ACTV to the read command RD needs to be set 20 ns or greater, the memory controller DRAMC supplies the read command RD two clocks after the active command ACTV. The burst length is set to "2".

The command decoder 14 activates the read command signal RDZ in response to the read command RD. Since the latency signal LT4MZ is at the high H, the latency counter 24 turns on the switches SW3 and SW5, and turns off the switch SW4. The latency counter 24 sequentially activates the read command signals RDPZ and RD1Z to RD3Z in response to the read command signal RDZ. The data output timing signal DOUTZ is activated three clocks after the read command RD. Although the activation period of the data output timing signal DOUTZ is two clock cycles, in order to secure a second data output period, the data output buffer 28 delays the trailing edge of the data output timing signal DOUTZ by about 5 ns. During the activation of the data output timing signal DOUTZ, the read data D0 and D1 are sequentially outputted from the data terminal DQ in synchronization with the internal clock signal ICLK. The memory controller DRAMC receives first read data D0 in synchronization with the rising edge of the fourth clock signal CLK after the read command RD.

In the operation mode MD1, since the power supply voltage VDDQ is high (1.8 V), the access time tAC is relatively short. The operation speed of the input buffers 10, 12 and 26 are also relatively fast, which is not shown. In the operation mode MD2, since the power supply voltage VDDQ is low (1.2 V), the access time tAC is relatively long. The operation speed of the input buffers 10, 12 and 26 are also relatively slow.

Figure 14:
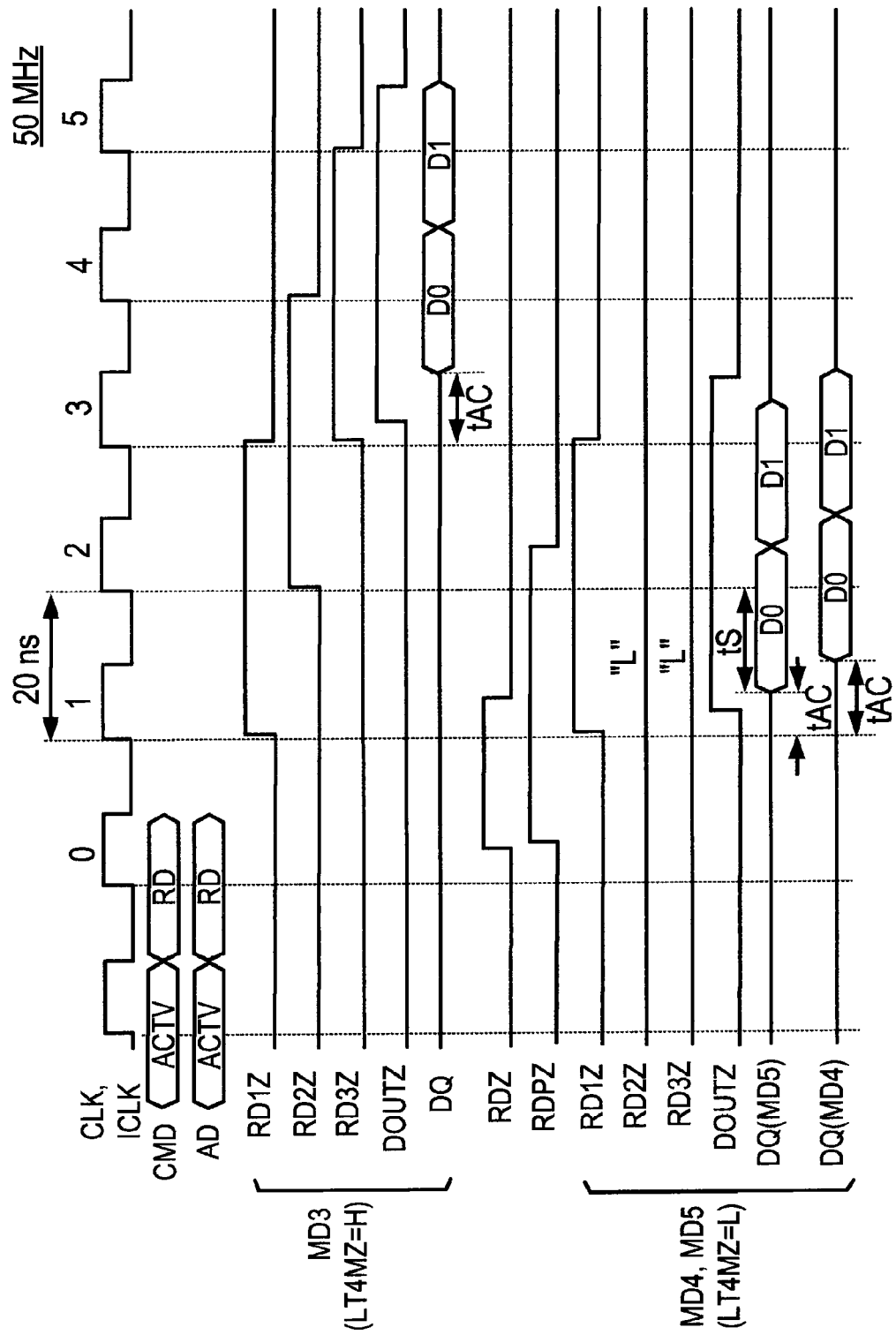
FIG. 14 shows a read operation from the DRAM.

FIG. 14 shows the read operation of the DRAM shown in FIG. 5 in the operation modes MD3 to MD5. In the operation modes MD3 to MD5, the frequency of the clock signal CLK is 100 MHz. In the operation mode MD3, the latency LAT is "4" (LT4MZ=H). In the operation modes MD4 to MD5, the latency LAT is "2" (LT4MZ =L). Since the clock cycle is 20 ns, the memory controller DRAMC supplies the read command RD one clock after an active command ACTV. The burst length is set to "2".

In the operation mode MD3, the latency counter 24 operates as in the read operation shown in FIG. 13, and activates the data output timing signal DOUTZ three clocks after the read command RD. In the operation modes MD4 to MD5, the latency counter 24 turns off the switches SW3 and SW5, and turns on the switch SW4. The data output timing signal DOUTZ is activated one clock after the read command RD. In the operation mode MD4, since the driving capability DRV of the data output buffer 28 is low, the access time tAC is relatively long. Since the driving capability DRV of the input buffers 10, 12 and 26 are also low, the operation speed of the input buffers 10, 12 and 26 are relatively slow, which is not shown. In the operation mode MD5, since the driving capability DRV of the data output buffer 28 is high, the access time tAC is relatively short. Since the driving capability DRV of the input buffers 10, 12 and 26 are also high, the operation speed of the input buffers 10, 12 and 26 are relatively fast.

Since the power supply voltage VDDQ or the frequency of the clock signal CLK is changed according to the access state of the DRAM, the power consumption of the DRAM is minimized. The power consumption of the DRAM which includes the charging/discharging power of the memory bus MBUS coupled between the memory controller DRAMC and the DRAM, is reduced. In the DRAM mounted on a portable device, the amount of consumption of a battery BAT is reduced, and the continuous operating time of the portable device is extended.

The power supply voltage VDDQ supplied to the input/output circuit CI/O for the memory controller DRAM is changed, thus the power consumption of the memory controller DRAMC is reduced, and the power consumption of the system device SYS is reduced.

Only power supply voltage VDDQ supplied to the input/output circuit MI/O is changed, and power supply voltage VDD supplied to the internal circuit of the DRAM is not changed. Therefore, a malfunction of the internal circuit based on a change in an operation mode MD is prevented, and the power consumption is reduced.

Figure 15:
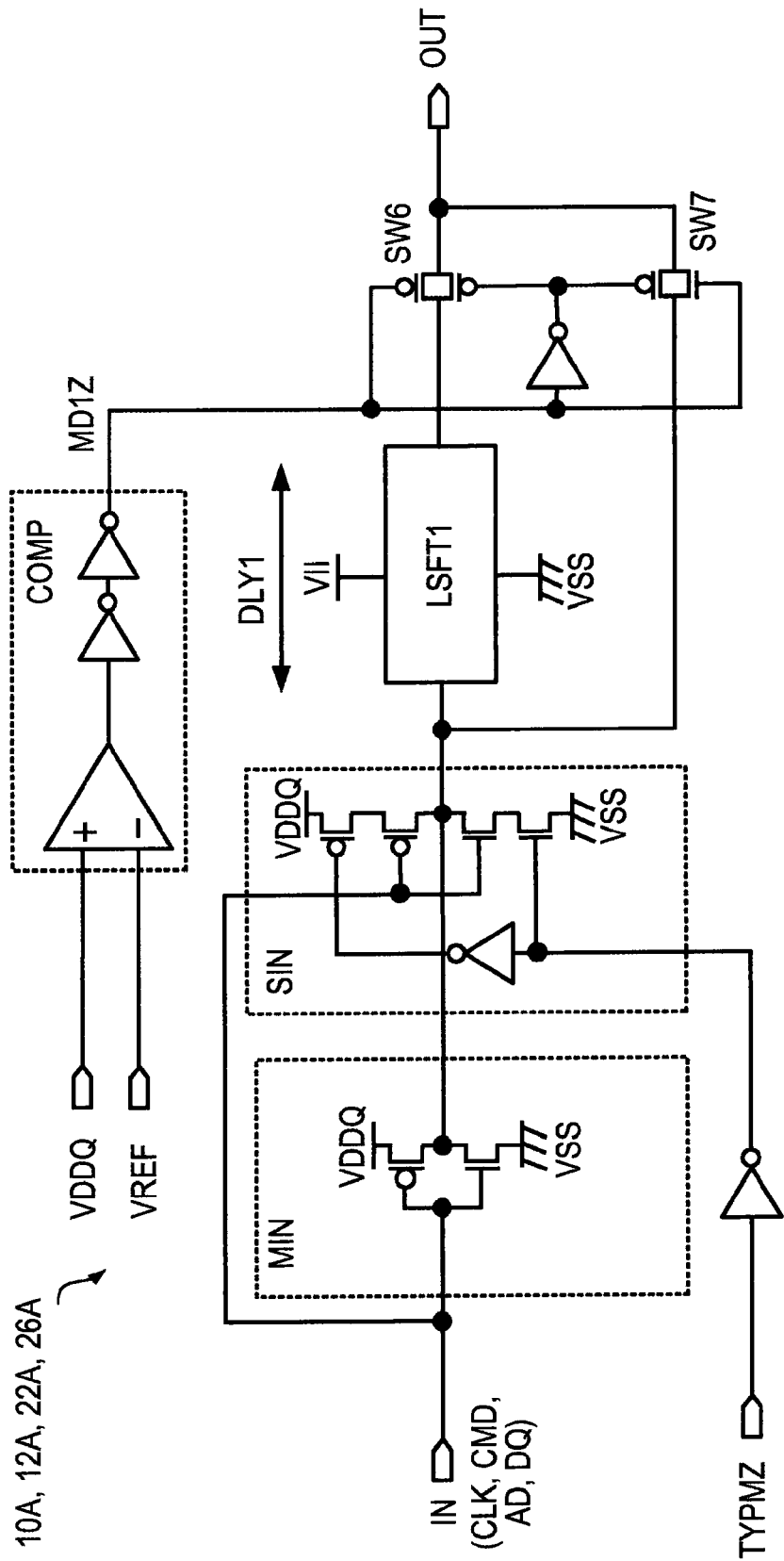
FIG. 15 shows another input buffer.

FIG. 15 shows another input buffer. In the input buffer shown in FIG. 15, the same elements as in the input buffer shown in FIG. 6 are designated by the same reference numbers, and the description will be omitted. The configuration, specification and operation are the same as those shown in FIGS. 1 to 5 and FIGS. 7 to 14, except for a clock input buffer 10A, a command input buffer 12A, an address input buffer 22A and a data input buffer 26A.

In the input buffers 10A, 12A, 22A and 26A, a comparing circuit COMP and switches SW6 and SW7 are added to the input buffers 10, 12, 22 and 26 of FIG. 6. Each of switches SW6 and SW7, for example, is a CMOS communication gate. The comparing circuit COMP may be provided so as to be shared by the input buffers 10A, 12A, 22A and 26A.

The comparing circuit COMP has a comparator for comparing the power supply voltage VDDQ and reference voltage VREF, and a pair of inverters coupled to the output of the comparator. The reference voltage VREF is 1.5 V, for example. The reference voltage VREF is generated by a voltage generating circuit provided within the DRAM. The reference voltage VREF may be supplied to the DRAM from the power supply controller PWRIC shown in FIG. 1.

The comparing circuit COMP sets a first operation mode signal MD1Z to the high level when the power supply voltage VDDQ is higher than the reference voltage VREF. The comparing circuit COMP sets the first operation mode signal MD1Z to the low level when the power supply voltage VDDQ is equal to or less than the reference voltage VREF. The first operation mode signal MD1Z at the high level represents a first operation mode MD1.

The switch SW6 is turned on when the operation mode signal MD1Z is at the low level (operation modes MD2 to MD5). The switch SW7 is turned on when the operation mode signal MDLZ is at the high level (operation mode MD1). In the operation modes MD2 to MD5 in which the power voltage VDDQ is less than the internal power voltage VII, an output signal from the main input buffer MIN is outputted to the output terminal OUT through the level shifter LSFT1. In the operation mode MD1 in which the power voltage VDDQ is higher than the internal power voltage VII, the output signal from the main input buffer MIN is outputted directly to the output terminal OUT without going through the level shifter LSFT1. The level shifter LSFT1 has predetermined power consumption and a predetermined delay time DLY1. In the operation mode MD1, the operation of the level shifter LSFT1 is not required, thus the power consumption of the DRAM is reduced. In the operation mode MD1 in which high speed is required, an output signal is outputted without going through the level shifter LSFT1, thus the operation speed of the input buffers 10A, 12A, 22A and 26A increases.

In the operation mode MD1, the power supply voltage VDDQ (1.8 V) is higher than the internal power voltage VII (1.6 V). Since the high-level output signal OUT (1.8 V) reliably turns off the pMOS transistor coupled to the output terminal OUT, leak current does not occur.

The embodiment shown in FIG. 15 has the same effect as that of the embodiment shown in FIG. 6. In the operation mode MD1 in which the power supply voltage VDDQ is higher than the internal power supply voltage VII, the output signal from the main input buffer MIN is outputted without going through the level shifter LSFT1, thus the power consumption of the DRAM is reduced, and the operation speed of the input buffers 10A, 12A, 22A and 26A increases.

Figure 16:
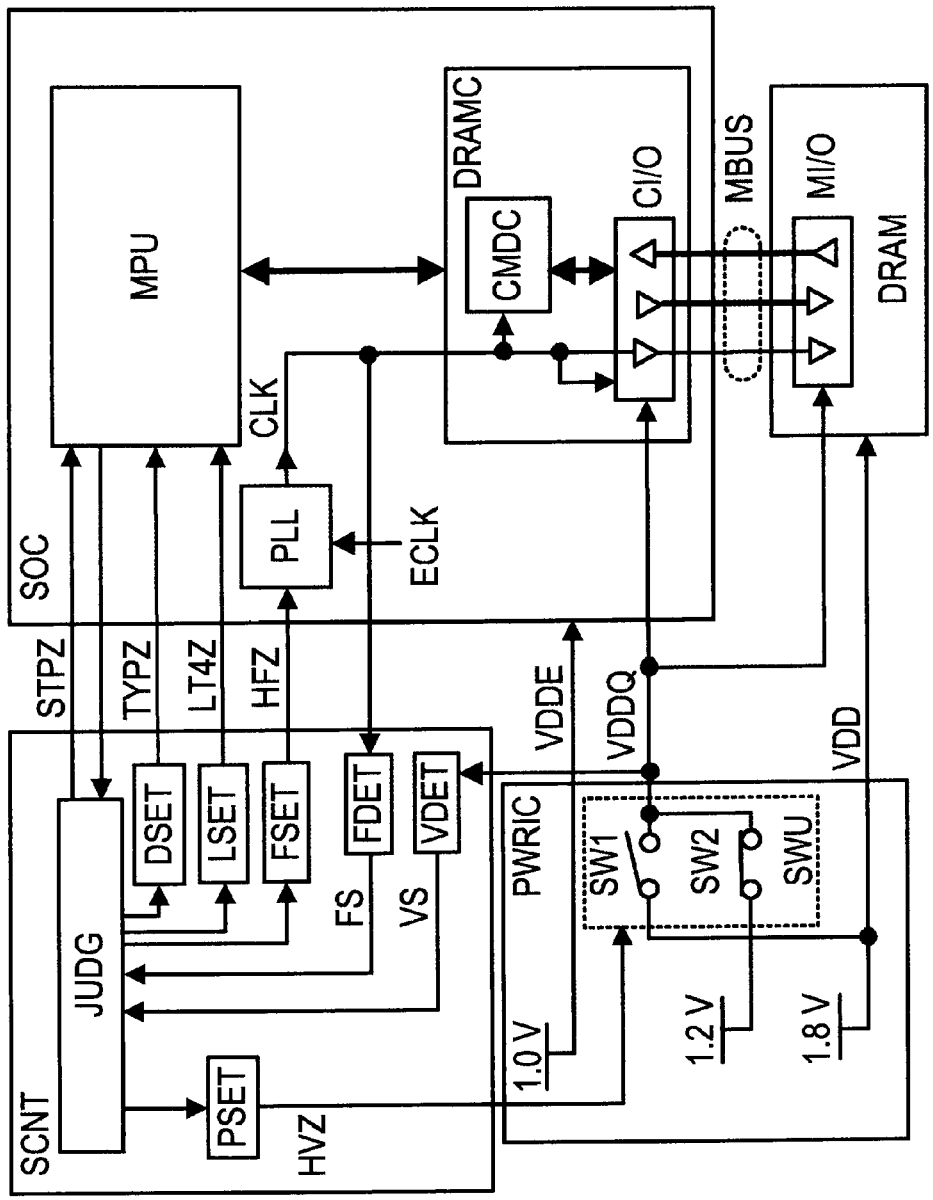
FIG. 16 shows a second embodiment.

FIG. 16 shows a second embodiment. In the second embodiment, the same elements as in the first embodiment are designated by the same reference numbers, and the description will be omitted. In the second embodiment, a frequency detecting unit FDET and a voltage detecting unit VDET are added to the system controller SCNT.

The frequency detecting unit FDET detects that a frequency is set to a predetermined value when the frequency of the clock signal CLK is changed. When the operation mode is changed from MD2 to MD3, the frequency detecting unit FDET monitors the frequency of the clock signal CLK and outputs a frequency setting signal FS to the judgment unit JUDG when the frequency is set to 50 MHz. When the operation mode is changed from MD3 to MD2, the frequency detecting unit FDET monitors the frequency of the clock signal CLK and outputs a frequency setting signal FS to the judgment unit JUDG when the frequency is set to 100 MHz. For example, the frequency detecting unit FDET outputs a frequency setting signal FS having logical levels that are different from each other according to two types of frequencies. Every time a frequency is set, the frequency detecting unit FDET outputs a frequency setting signal FS having a pulse.

The power detecting unit VDET detects that the power supply voltage VDDQ is set to a predetermined value when the power supply voltage VDDQ is changed. When the operation mode is changed from MD1 to MD2, the voltage detecting unit VDET monitors the power supply voltage VDDQ and outputs a voltage setting signal VS to the judgment unit JUDG when the power supply voltage VDDQ is set to 1.2 V. When the operation mode is changed from MD2 to MD1, the voltage detecting unit VDET monitors the power supply voltage VDDQ and outputs a voltage setting signal VS to the judgment unit JUDG when the power supply voltage VDDQ is set to 1.8 V. For example, the voltage detecting unit VDET outputs a voltage setting signal VS having logical levels that are different from each other according to two types of power supply voltage VDDQ. Every time power supply voltage VDDQ is set, the voltage detecting unit VDET outputs a voltage setting signal VS having a pulse.

The judgment unit JUDG has a function for outputting a stop signal STPZ, in addition to functions shown in FIG. 2. When the operation mode is changed from MD2 to MD3, and MD3 to MD2, the judgment unit JUDG activates the stop signal STPZ until a frequency setting signal FS is received, and inactivates the stop signal STPZ in synchronization with the frequency setting signal FS. When the operation mode is changed from MD1 to MD2, and MD2 to MD1, the judgment unit JUDG activates the stop signal STPZ until a voltage setting signal VS is received, and inactivates the stop signal STPZ in synchronization with the voltage setting signal VS.

The MPU prohibits a command signal for accessing the DRAM from being outputted while the stop signal STPZ is being activated, and restarts the access to the DRAM after the stop signal STPZ is inactivated. When the frequency of the clock signal CLK is not stabilized, and when the power supply voltage VDDQ is not stabilized, the access to the DRAM may be prevented. A malfunction of the DRAM may be prevented.

Figure 17:
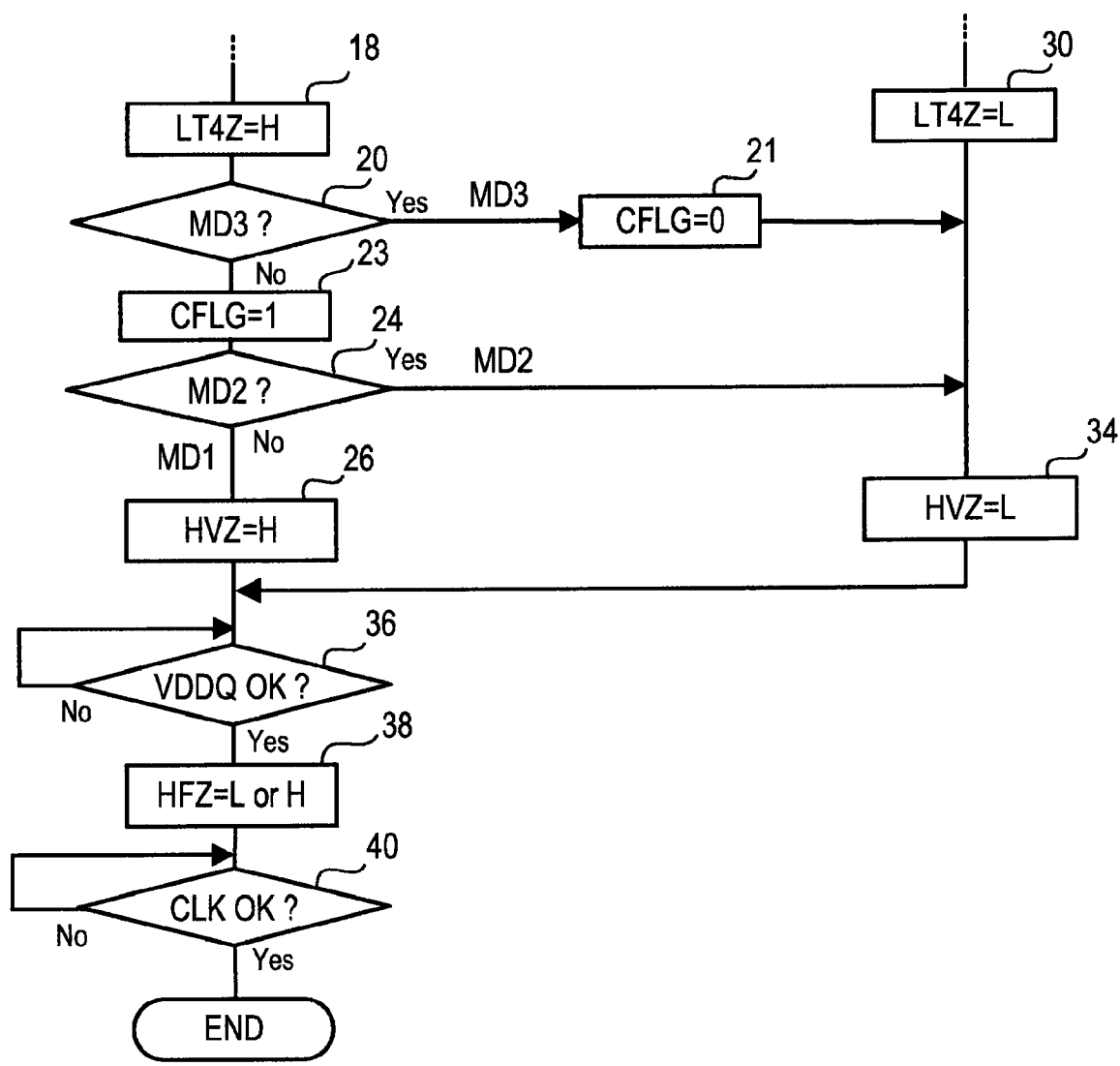
FIG. 17 shows a control method for the DRAM.

FIG. 17 shows the control of the DRAM by the system controller SCNT shown in FIG. 16. The same elements as in the first embodiment are designated by the same reference numbers, and the description will be omitted. The specification and operation of the second embodiment are the same as those shown in FIG. 1, and FIGS. 3 to 14. In the flow shown in FIG. 17, an operation 21 is added between the operation 20 and the operation 34 in the flow shown in FIG. 4. An operation 23 is inserted in place of the operation 22 shown in the flow of FIG. 4, and operations 36, 38 and 40 are added after the operations 26 and 34. The flow until the operations 18 and 30 are the same as the operations 10 to 16 and 28 shown in FIG. 4.

In the second embodiment, when the power supply voltage VDDQ is changed, the system controller SCNT waits until the changed power supply voltage VDDQ is stabilized based on the voltage setting signal VS from the voltage detecting unit VDET. When the frequency of the clock signal CLK is changed, the system controller SCNT waits until the changed frequency is stabilized based on the frequency setting signal FS of the frequency detecting unit FDET.

Since the frequency of the clock signal CLK is changed in the operation 38, the system controller SCNT sets a clock flag CFLG to "0" (indicates 50 MHz) in the operation 21, and sets the clock flag CFLG to "1" (indicates 100 MHz) in the operation 23. In the operations 26 and 34, the system controller SCNT activates the stop signal STPZ.

In the operation 36, the system controller SCNT detects that the power supply voltage VDDQ is stabilized to a predetermined value based on the voltage detecting unit VDET. In the operation 38, in order to set the frequency of the clock signal CLK, the system controller SCNT sets the setting value HFZ to the low level or the high level depending on the value of the clock flag CFLG. In the operation 40, the system controller SCNT waits until the frequency of the clock signal CLK is stabilized to a predetermined value based on the frequency detecting unit FDET. By waiting until the frequency is stabilized, the timing specification (AC timing specification) of a signal inputted/outputted to/from the DRAM is assured.

The system controller SCNT inactivates the stop signal STPZ shown in FIG. 16 when "Yes" is determined in the operation 40. The MPU restarts the access to the DRAM.

The second embodiment has the same effect as that of the first embodiment. In the second embodiment, when the frequency of the clock signal CLK is not stabilized, and when the power supply voltage VDDQ is not stabilized, the access to the DRAM may be prevented. A malfunction of the DRAM is prevented, and the power consumption is reduced.

Figure 18:
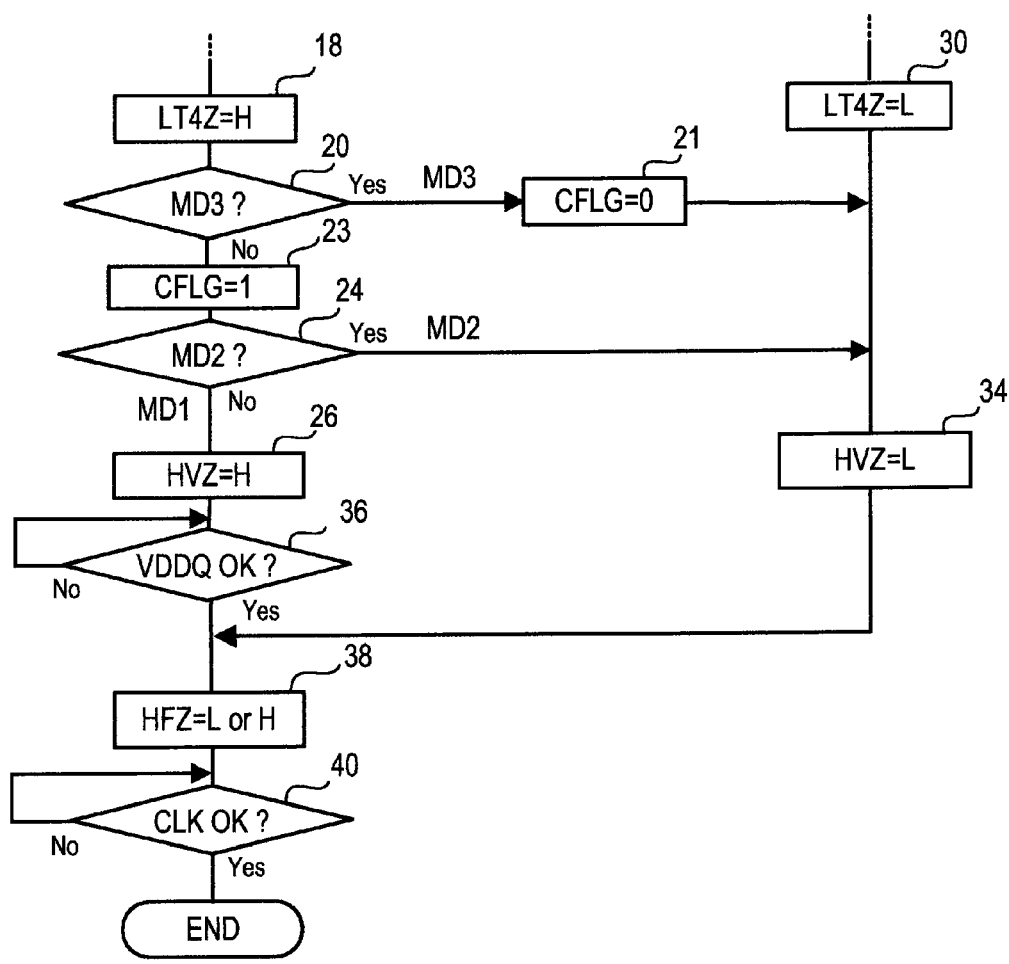
FIG. 18 shows a third embodiment.

FIG. 18 shows a third embodiment. FIG. 18 shows the control method for the DRAM by the system controller SCNT shown in FIG. 2. The same elements as in the other embodiments are designated by the same reference numbers, and the description will be omitted. The specification and operation of the third embodiment are the same as those shown in FIG. 1, and FIGS. 3 to 14. The configuration of the system device SYS of the third embodiment is the same as that of FIG. 16. In the flow shown in FIG. 18, the operation 38 is performed after the operation 34 shown in FIG. 17. The judgment unit JUDG shown in FIG. 16 inactivates the stop signal STPZ depending on the voltage setting signal VS from the voltage detecting unit VDET only when the power supply voltage VDDQ is changed from 1.2 V to 1.8 V (that is to say, only when the mode is changed to MD1). The MPU and the memory controller DRAMC temporarily stop the access to the DRAM when the power supply voltage VDDQ is changed from 1.2 V to 1.8 V, and do not stop the access to the DRAM when the power supply voltage VDDQ is changed from 1.8 V to 1.2 V.

When the power supply voltage VDDQ is lowered, the operation of the input/output circuit MI/O of the DRAM becomes gradually slow, and the driving capability DRV of the input/output circuit MI/O is gradually reduced. Therefore, the operating margin of the circuit changes from high to low. This is also true for input/output circuit CI/O of the memory controller DRAMC. Since no problem occurs when the operating margin is high, it is not required to wait until the power supply voltage VDDQ is stabilized to 1.2 V when the power supply voltage VDDQ is changed from 1.8 V to 1.2 V. When the power supply voltage VDDQ is changed from 1.8 V to 1.2 V, the operation mode is switched quickly. When the operation mode is switched from MD1 to MD2, the waste of unnecessary time can be prevented, and power consumption during it can be reduced. Time for switching the operation mode can be shortened, thus an idle period in which the DRAM cannot be accessed may be reduced, and the performance of the system device SYS is improved.

The third embodiment has the same effect as that of the other embodiments. In the third embodiment, since the time for switching the operation mode is shortened, the performance of the system device SYS is improved.

Figure 19:
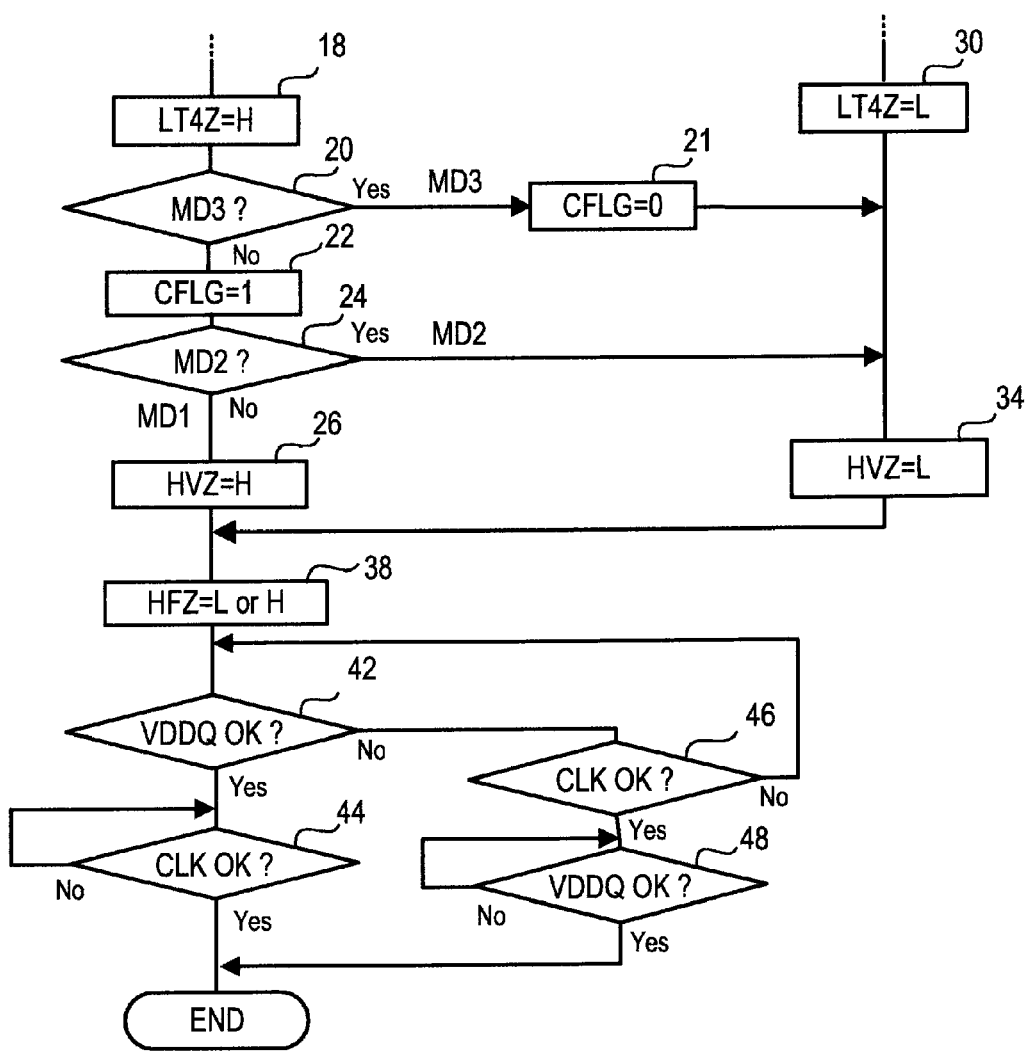
FIG. 19 shows a fourth embodiment.

FIG. 19 shows a fourth embodiment. FIG. 19 shows the control method for the DRAM by the system controller SCNT shown in FIG. 2. The same elements as in the other embodiments are designated by the same reference numbers, and the detailed description will be omitted. The configuration, specification and operation of the fourth embodiment are the same as those shown in FIG. 1, and FIGS. 3 to 14. In the flow shown in FIG. 19, operations 42, 44, 46 and 48 are inserted in place of the operations 36, 38 and 40 shown in FIG. 17.

In the operation 42, the system controller SCNT determines whether or not the power supply voltage VDDQ reaches a predetermined value. When the power supply voltage VDDQ reaches the predetermined value, the process goes to the operation 44. When the power supply voltage VDDQ does not reach the predetermined value, the process goes to the operation 46. In the operation 44, the system controller SCNT waits until the frequency of the clock signal CLK is stabilized to the predetermined value. When the frequency reaches the predetermined value, the power supply voltage VDDQ and the frequency of the clock signal CLK are changed, and the process ends.

In the operation 46, the system controller SCNT determines whether or not the frequency of the clock signal CLK reaches a predetermined value. When the frequency reaches the predetermined value, the process goes to the operation 48. When the frequency does not reach the predetermined value, the process returns to the operation 42, and the value of the power supply voltage VDDQ is determined. In the operation 48, the system controller SCNT waits until the power supply voltage VDDQ is stabilized to the predetermined value. When the power supply voltage VDDQ reaches the predetermined value, the power supply voltage VDDQ and the frequency of the clock signal CLK are changed, and the process ends.

The fourth embodiment has the same effect as that of the other embodiments. In the fourth embodiment, the power supply voltage VDDQ and the frequency of the clock signal CLK are alternately judged repeatedly. Since the power supply voltage VDDQ and the frequency of the clock signal CLK are judged almost concurrently, the time for switching the operation mode MD is shortened. Since the time for switching the operation mode is shortened, the performance of the system device SYS is improved.

Figure 20:
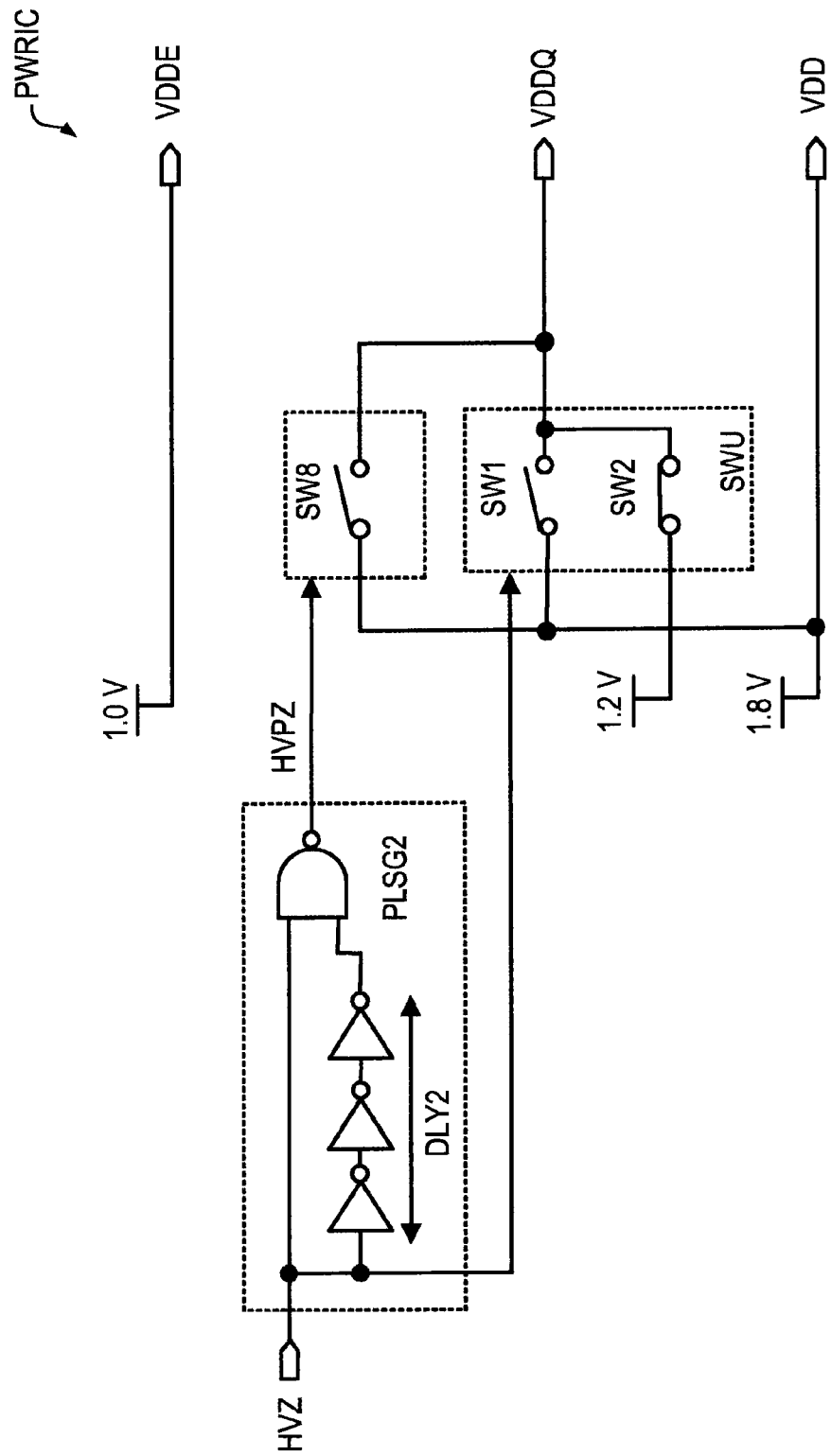
FIG. 20 shows a fifth embodiment.

FIG. 20 shows a fifth embodiment. FIG. 20 shows the substantial part of the power supply controller PWRIC shown in FIG. 2 or FIG. 16. The same elements as in the other embodiments are designated by the same reference numbers, and the description will be omitted. The configuration, specification and operation of the fifth embodiment are the same as those shown in FIG. 1 to FIG. 14. The fifth embodiment may be applied to the embodiment shown in FIG. 15 to FIG. 19.

In the power supply controller PWRIC, a pulse generating circuit PLSG2 and a switch SW8 are added to the power supply controller PWRIC shown in FIG. 2 or FIG. 16. The pulse generating circuit PLSG2 generates a high-level detecting pulse HVPZ when the setting value HVZ is changed from the low level to the high level. The pulse width of the detecting pulse HVPZ is equal to the delay time DLY2 of an inverter column of the pulse generating circuit PLSG2. The switch SW8 is turned on during the high-level period of the detecting pulse HVPZ. During the high-level period of the detecting pulse HVPZ, power supply voltage of 1.8 V is supplied to the power supply line VDDQ through the switch SW8 in addition to the switch SW1. The switch SW8 temporarily outputs relatively high power supply voltage VDDQ (1.8 V).

Figure 21:
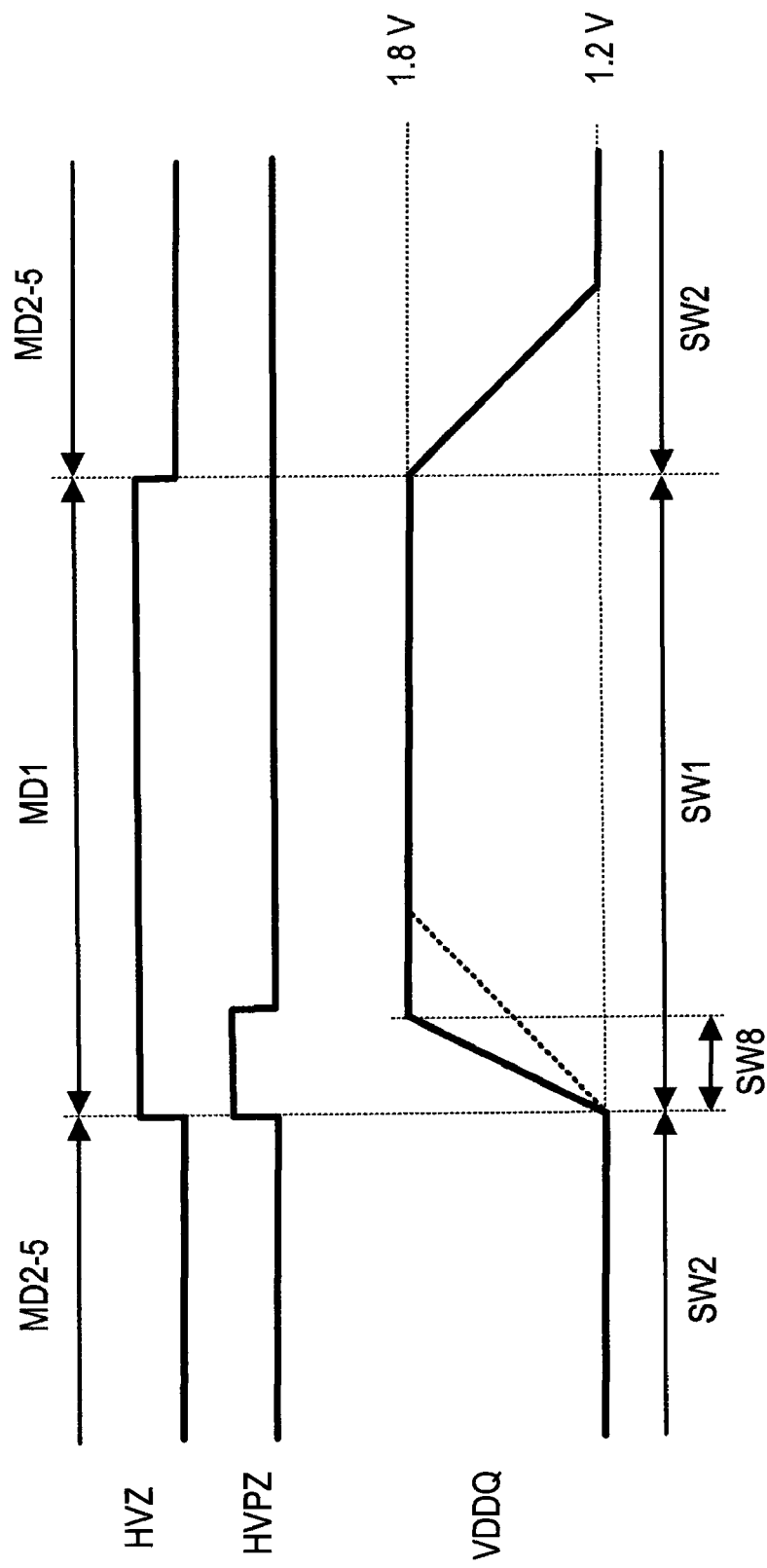
FIG. 21 shows an operation of a power supply controller.

FIG. 21 shows the operation of the power supply controller PWRIC shown in FIG. 20. The ON period of each of switches SW1, SW2 and SW8 is shown by an arrow. When the operation mode is switched from MD2 (or MD3 to MD5) to MD1, the system controller SCNT changes the setting value HVZ from the low level to the high level. The detecting pulse HVPZ is temporarily changed to the high level. Since turning the switches SW1 and SW8 on raises temporarily the supply capability of the power supply voltage VDDQ and the power supply voltage VDDQ raises sharply, the time for switching from any one of the operation modes MD2 to MD5 to the operation mode MD1 becomes shortened.

The change in the power supply voltage VDDQ at turning-on of only the switch SW1 is shown by a dashed line in FIG. 21 as a comparative example. When the power supply voltage VDDQ is changed from 1.8 V to 1.2 V, the operating margin of the circuit is changed from high to low, therefore, the power supply voltage VDDQ is not required to be reduced sharply.

The fifth embodiment has the same effect as that of the other embodiments. In the fifth embodiment, since the time for switching the operation mode is shortened, the performance of the system device SYS is improved.

In the embodiment described above, the power supply voltage VDDQ and the frequency of the clock signal CLK supplied to the DRAM are adjusted. However, the power supply voltage and the frequency of the clock signal CLK supplied to input/output circuits of another semiconductor memory, such as a pseudo SRAM, a SRAM or a flash memory, may be adjusted.

The DRAM of the above embodiment has a voltage generating circuit 20 for converting the power supply voltage VDD (1.8 V) into internal power supply voltage VII (first power supply voltage; 1.6 V). However, without providing the voltage generating circuit 20 on the DRAM, power supply voltage VDD of 1.6 V may be supplied to the DRAM as first power supply voltage.

In FIG. 3, according to five operation modes MD1 to MD5, the power supply voltage VDDQ, the frequency of the clock signal CLK, the latency LAT and the driving capability DRV of the input/output circuit MI/O are adjusted. However, for example, as in the sixth embodiment shown in FIG. 22, according to three operation modes MD1 to MD3, the power supply voltage VDDQ and the frequency of the clock signal CLK may be adjusted. In FIG. 22, the setting value LT4Z of the latency setting unit LSET may be set to the low level in the operation mode MD3. In FIG. 22, the setting value TYPZ of the driver setting unit DSET may be set to the low level in the operation modes MD2 to MD3.

As in the seventh embodiment shown in FIG. 23, according to four operation modes MD1 to MD4, the power supply voltage VDDQ, the frequency of the clock signal CLK, the latency LAT and the driving capability DRV of the input/output circuit MI/O may be adjusted. In FIG. 23, when the operation mode is changed from MD2 to MD1, the frequency of the clock signal CLK is changed from 50 MHz to 100 MHz, and, at the same time, the read latency LAT is changed from "2" to "4". The power supply voltage VDDQ is changed between the operation modes MD2 and MD3. The driving capability DRV is changed between the operation modes MD3 and MD4.

Figure 24:
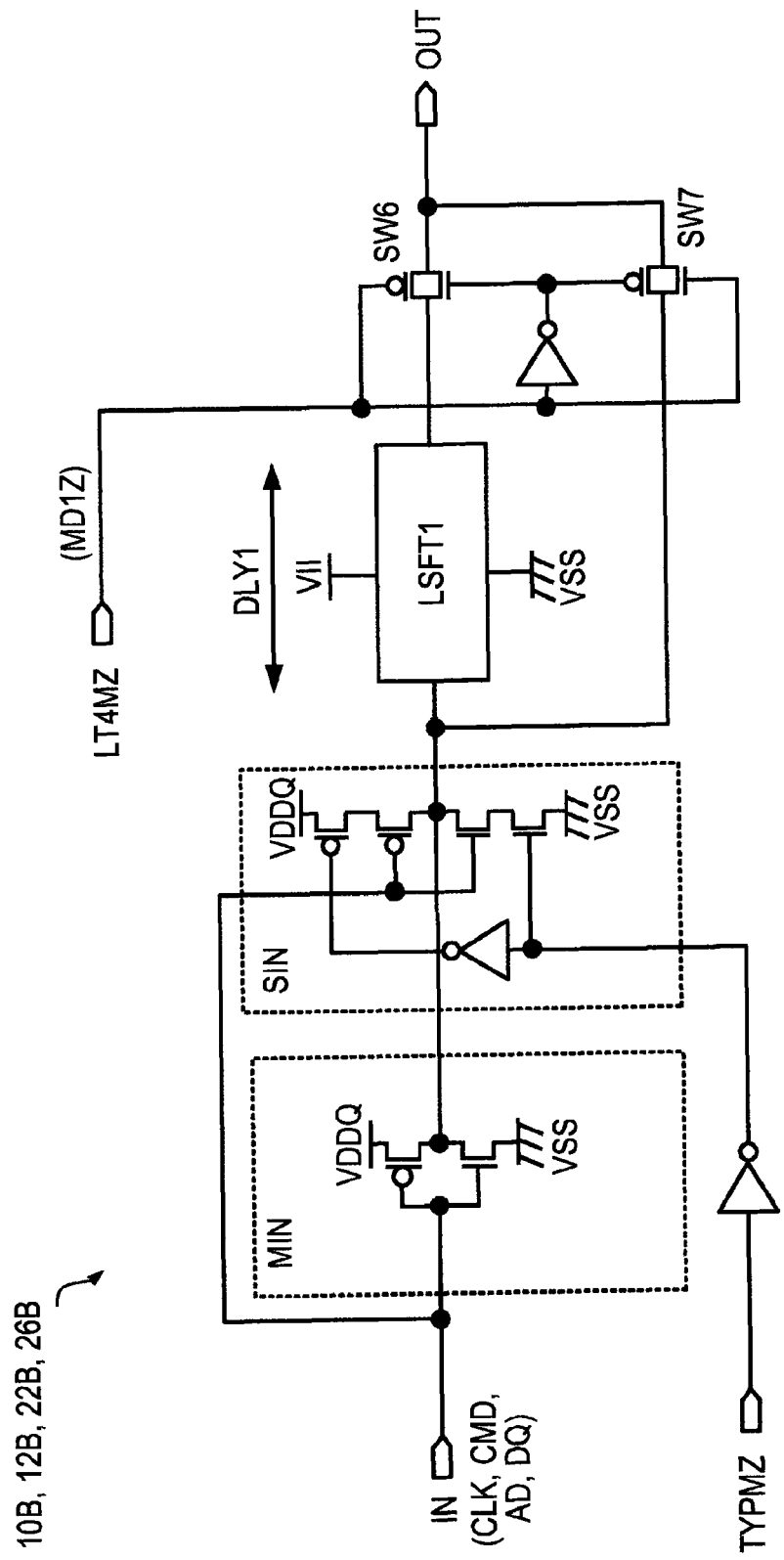
FIG. 24 shows a data input buffer.

FIG. 24 shows the data input buffers 10B, 12B, 22B and 26B of the DRAM having the operation modes shown in FIG. 23. The data input buffers 10B, 12B, 22B and 26B do not supply the output signal from the comparing circuit COMP shown in FIG. 15, but a latency signal LT4MA, to the switches SW6 and SW7 as a first operation mode signal MD1Z. Other configuration in FIG. 24 is the same as that of the data input buffers 10A, 12A, 22A and 26A shown in FIG. 15. Only when the power supply voltage VDDQ is high (1.8 V), and the clock frequency is high (100 MHz), an output signal OUT is outputted without going through the level shifter LSFT1.

In the sixth embodiment, the driving capability DRV of the input buffers 10, 12, 22 and 26 and the data output buffer 28 are switched. However, for example, only the driving capability DRV of one of input buffers 10, 12, 22 and 26 or the data output buffer 28 may be switched.

In FIGS. 17, 18 and 19, there is a wait until both of the power supply voltage VDDQ and the frequency of the clock signal CLK reach a predetermined value. However, for example, when the power supply voltage VDDQ can be changed quickly, there may be a wait until only the frequency of the clock signal CLK reaches a predetermined value. When the frequency of the clock signal CLK can be changed quickly, there may be a wait until only the power supply voltage VDDQ reaches a predetermined value. Time for switching the operation mode is shortened, and the power consumption is reduced.

Figure 25:
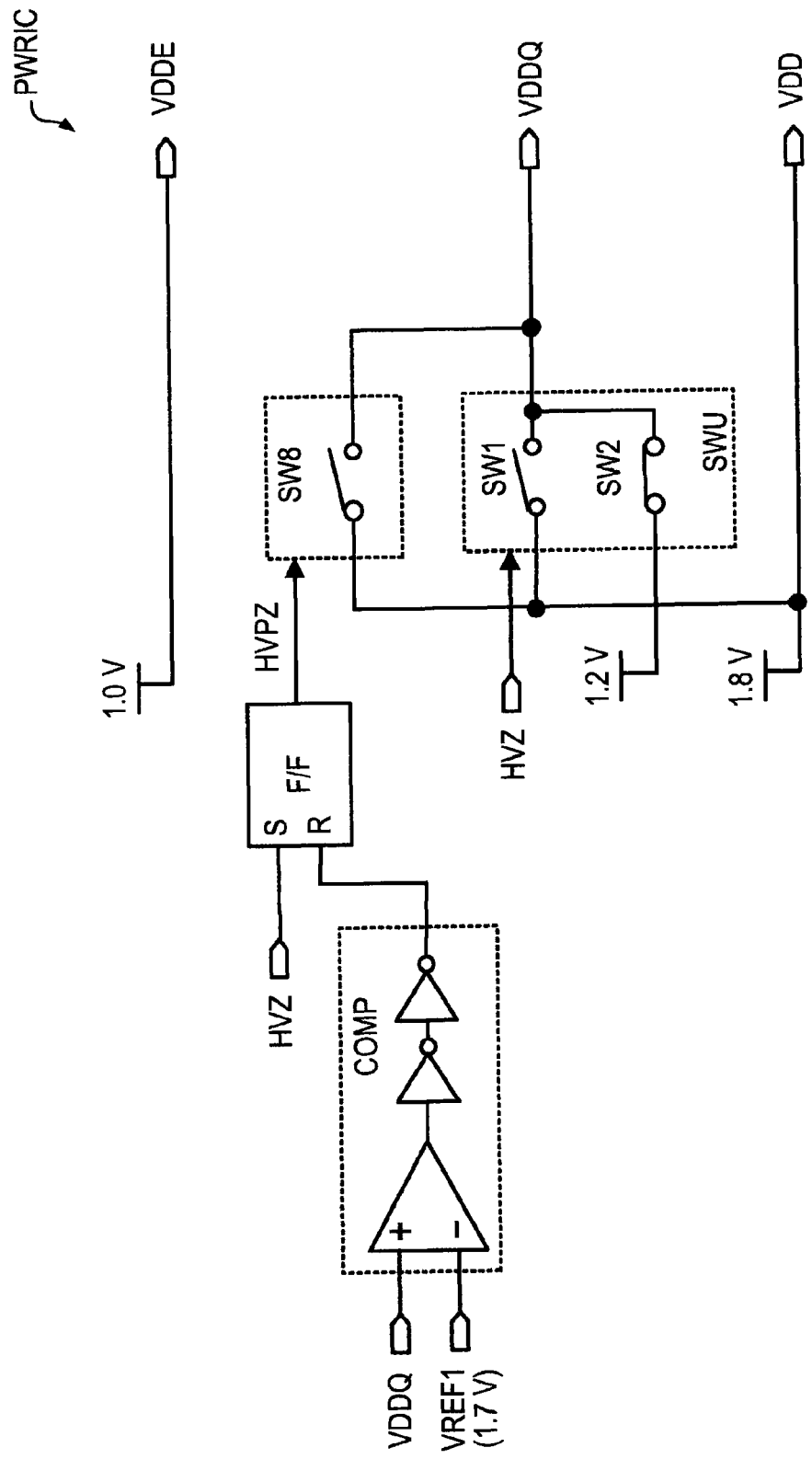
FIG. 25 shows a power supply controller.
Figure 26:
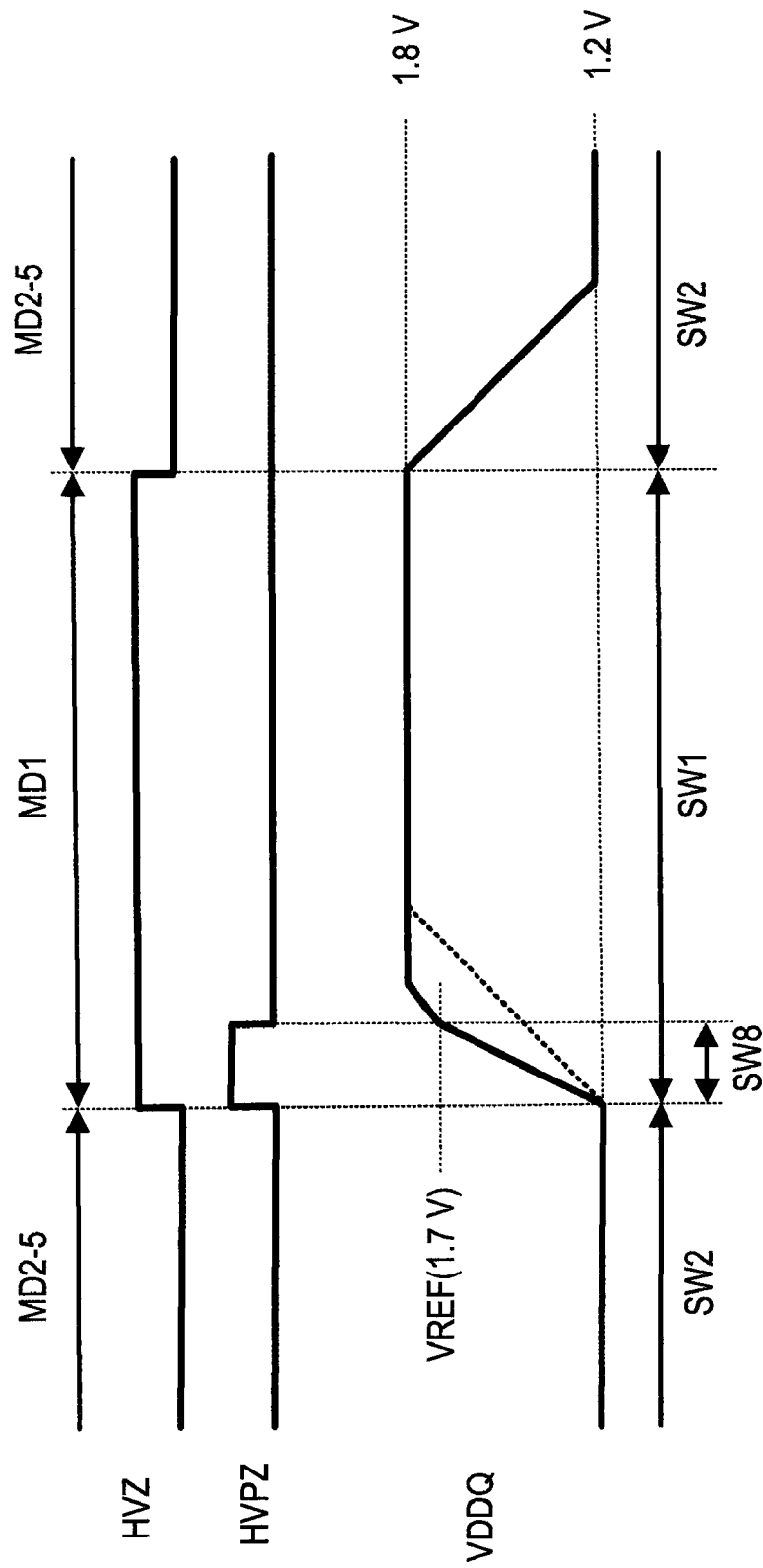
FIG. 26 shows an operation of the power supply controller.

In FIG. 20, when the operation mode is switched from the mode MD2 to MD1, and the voltage adjustment signal HVZ is changed to the high level, the switch SW8 is turned on for a predetermined period of time (DLY2). However, for example, as shown in FIGS. 25 and 26, a comparing circuit COMP and a flip-flop are provided on the power supply controller PWRIC and, when the operation mode is switched from MD2 to MD1, the switch SW8 may be turned on until the power supply voltage VDDQ exceeds the predetermined voltage. The predetermined voltage is reference voltage VREF1 (1.7 V) generated within the power supply controller PWRIC.

A flip-flop F/F is set in synchronization with the rising edge of the voltage adjustment signal HVZ, and changes the detecting pulse HVPZ to the high level. The flip-flop F/F is set in synchronization with the rising edge of the output signal of the comparing circuit COMP, and changes the detecting pulse HVPZ to the low level. The comparing circuit COMP outputs the high level when the power supply voltage VDDQ exceeds the reference voltage VREF1.

Figure 27:
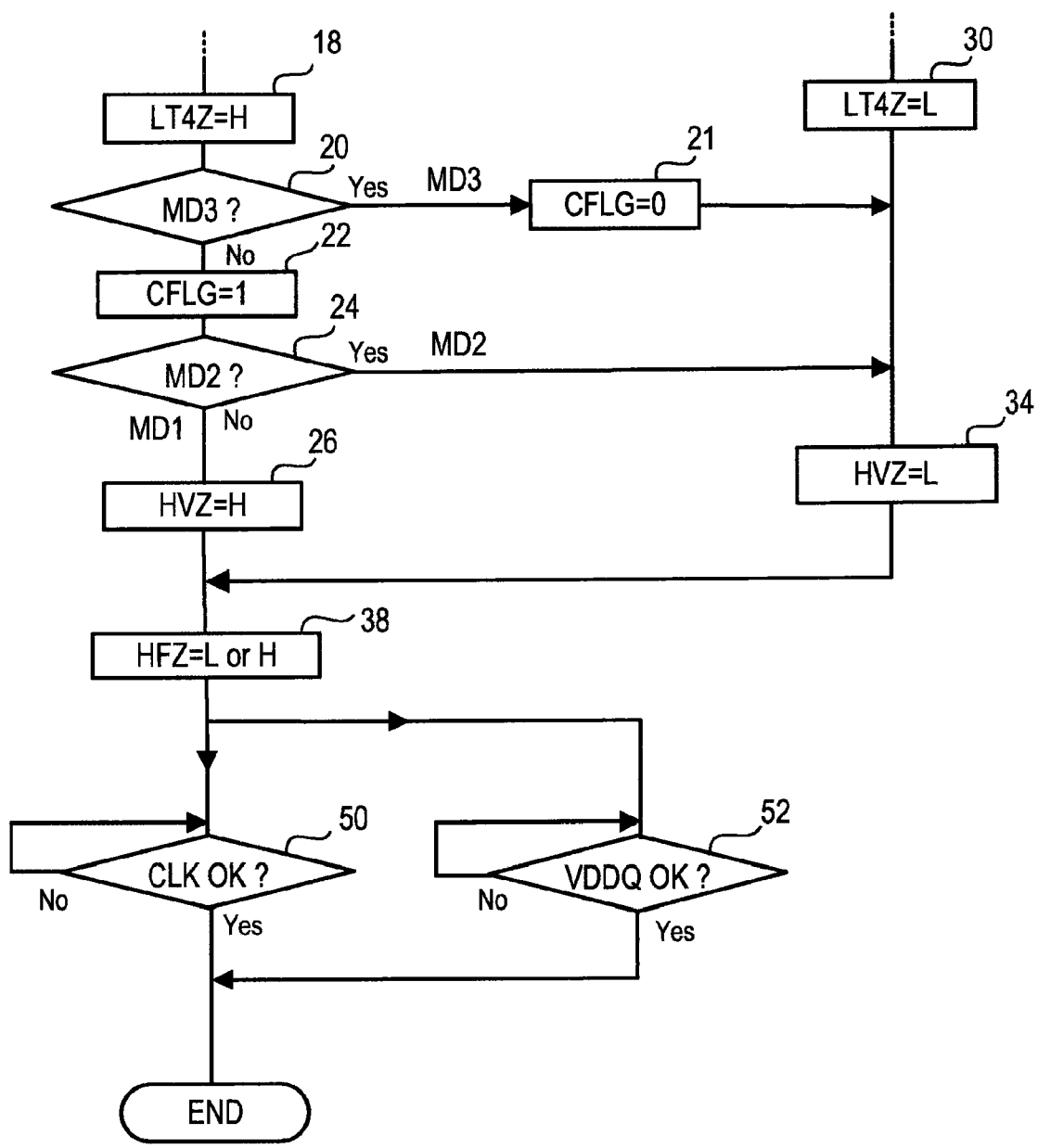
FIG. 27 shows a seventh embodiment.

In FIG. 19, the power supply voltage VDDQ and the frequency of the clock signal CLK are alternately judged. However, for example, as in the seventh embodiment shown in FIG. 27, the operations 50 and 52 may be performed in place of the operations 42, 44, 46 and 48 of FIG. 19. In the flow of FIG. 27, after the operation 38 is performed, the operations 50 and 52 are separately performed by control units that are different from each other. When one control unit detects that the frequency of the clock signal CLK is set to a predetermined value, and when the other control unit detects that the power supply voltage VDDQ is set to a predetermined value, the control for switching the operation mode is completed. The power supply voltage VDDQ and the frequency of the clock signal CLK are separately judged, thus the time for switching the operation mode is shortened, and the performance of the system device SYS is improved.

Example embodiments of the present invention have now been described in accordance with the above advantages. It will be appreciated that these examples are merely illustrative of the invention. Many variations and modifications will be apparent to those skilled in the art.

The invention is claimed:

1. A memory system comprising:
a semiconductor memory that includes an internal circuit, which operates according to a first power supply voltage, and a memory input/output circuit, which is coupled to the internal circuit and operates according to a second power supply voltage, where the semiconductor memory operates in synchronization with a clock signal;
a first control unit that includes a control input/output circuit, which is coupled to the memory input/output circuit and operates according to the second power supply voltage, where the first control unit operates in synchronization with the clock signal;
a voltage generating unit that generates the second power supply voltage and changes the second power supply voltage according to a voltage adjustment signal;
a clock generating unit that generates the clock signal and changes the frequency of the clock signal according to a clock adjustment signal; and
a second control unit that generates the voltage adjustment signal and the clock adjustment signal according to an access state of the semiconductor memory provided by the first control unit;
wherein the memory input/output circuit comprises:
an input buffer;
a level shifter, disposed between the input buffer and the internal circuit, that converts a signal level of the second power supply voltage outputted from the input buffer into a signal level of the first power supply voltage; and
a switch circuit that selectively couples the output of the level shifter or the output of the input buffer to the internal circuit based on a relationship between the second power supply voltage and the first power supply voltage.

2. The memory system according to claim 1, wherein the semiconductor memory includes a plurality of operation modes, wherein the second control unit determines an operation mode according to the access state of the semiconductor memory and generates at least one of the voltage adjustment signal and the clock adjustment signal based on the operation mode.

3. The memory system according to claim 2, wherein the plurality of operation modes includes one of an operation mode in which the second power supply voltage is high and the frequency of the clock signal is high, an operation mode in which the second power supply voltage is low and the frequency of the clock signal is high, and an operation mode in which the second power supply voltage is low and the frequency of the clock signal is low.

4. The memory system according to claim 2, wherein the semiconductor memory comprises:
a latency register that sets a latency which is the number of clock cycles from receiving a read command to outputting the read data,
wherein the first control unit changes the latency based on the operation mode determined by the second control unit.

5. The memory system according to claim 3, wherein the operation mode in which the frequency of the clock signal is low has either one of a high latency operation mode and a low latency operation mode, or a high driving capability operation mode and a low driving capability operation mode.

6. The memory system according to claim 2, wherein the memory input/output circuit includes at least one of the input buffer and an output buffer which driving capabilities are changed,
wherein the semiconductor memory includes a drive register which changes the driving capability, and
wherein the first control unit accesses the drive register in order to change the driving capability based on the operation mode determined by the second control unit.

7. The memory system according to claim 6, wherein at least either of the input buffer and the output buffer includes a plurality of transistors coupled in parallel, and
wherein one of the transistors operates according to a setting value of the drive register.

8. The memory system according to claim 1, wherein either of the first control unit and the second control unit includes a voltage detecting unit that detects when the second power supply voltage is set to a predetermined value, and
wherein the first control unit stops access to the semiconductor memory when the second power supply voltage is changed, and restarts the access to the semiconductor memory after the detection by the voltage detecting unit.

9. The memory system according to claim 8, wherein the power detecting unit that detects when the second power supply voltage is set to the predetermined value when the second power supply voltage is changed from a second voltage to a first voltage, and
wherein the first control unit stops the access to the semiconductor memory when the second power supply voltage is changed from the second voltage to the first voltage, restarts the access to the semiconductor memory after it is determined that the second power supply voltage is set to the predetermined value, and accesses the semiconductor memory when the second power supply voltage is changed from the second voltage to the first voltage.

10. The memory system according to claim 1, wherein either one of the first control unit and the second control unit includes a frequency detecting unit that detects when the frequency is set to a predetermined value, and
wherein the first control unit stops access to the semiconductor memory when the frequency is changed, and restarts the access to the semiconductor memory after the detection by the frequency detecting unit.

11. A memory system comprising:
a semiconductor memory that includes an internal circuit, which operates according to a first power supply voltage, and a memory input/output circuit, which is coupled to the internal circuit and operates according to a second power supply voltage, where the semiconductor memory operates in synchronization with a clock signal;
a first control unit that includes a control input/output circuit, which is coupled to the memory input/output circuit and operates according to the second power supply voltage, where the first control unit operates in synchronization with the clock signal;
a voltage generating unit that generates the second power supply voltage and changes the second power supply voltage according to a voltage adjustment signal;
a clock generating unit that generates the clock signal and changes the frequency of the clock signal according to a clock adjustment signal; and a second control unit that generates the voltage adjustment signal and the clock adjustment signal according to an access state of the semiconductor memory provided by the first control unit;

wherein the voltage generating unit comprises:

a first generating unit that outputs the second power supply voltage having a first voltage;

a second generating unit that outputs the second power supply voltage having a second voltage; and a third generating unit that temporarily outputs the first voltage when the second power supply voltage is changed from the second voltage to the first voltage.

12. A method for controlling semiconductor memory which operates in synchronization with a clock signal and includes a plurality of operation modes, the method comprising:

making an internal circuit of the semiconductor memory operate according to a first power supply voltage, inputting/outputting a signal to/from the internal circuit according to a second power supply voltage, determining an operation mode according to an access state of the semiconductor memory, changing at least one of the second power supply voltage and the frequency of the clock signal based on the determined operation mode;

converting a signal level of the second power supply voltage outputted from an input buffer into a signal level of the first power supply voltage, and selectively coupling the output of a level shifter disposed between the input buffer and the internal circuit or the output of the input buffer to the internal circuit based on a relationship between the second power supply voltage and the first power supply voltage.

13. The method according to claim 12, wherein the plurality of operation modes includes at least one of an operation mode in which the second power supply voltage is high and the frequency of the clock signal is high, an operation mode in which the second power supply voltage is low and the frequency of the clock signal is high, and an operation mode in which the second power supply voltage is low and the frequency of the clock signal is low.

14. The method according to claim 12, comprising:

changing a latency, where the latency is the number of clock cycles from receiving a read command to outputting the read data, based on the determined operation mode.

15. The method according to claim 12, comprising:

changing a driving capability of at least one of the input buffer and an output buffer based on the determined operation mode.

16. The method according to claim 12, comprising:

detecting when the second power supply voltage is set to a predetermined value;

stopping access to the semiconductor memory when the second power supply voltage is changed; and restarting the access to the semiconductor memory after the detection.

17. The method according to claim 12, comprising:

detecting when the second power supply voltage is set to a predetermined value;

stopping the access to the semiconductor memory when the second power supply voltage is changed from a second voltage to a first voltage;

restarting the access to the semiconductor memory after detecting when the second power supply voltage is set to the predetermined value; and accessing the semiconductor memory when the second power supply voltage is changed from the first voltage to the second voltage.

18. The method according to claim 12, comprising:

detecting when the frequency is set to a predetermined value;

stopping access to the semiconductor memory when the frequency is changed; and restarting the access to the semiconductor memory after the detection.

19. The control method for memory according to claim 12, comprising:

increasing the supply capability of the second power supply voltage when the second power supply voltage is changed from a second voltage to a first voltage.

* * * * *